(12) United States Patent
Tomiha et al.

(10) Patent No.: US 9,983,281 B2
(45) Date of Patent: *May 29, 2018

(54) MAGNETIC RESONANCE IMAGING APPARATUS, BED DEVICE AND RF COIL DEVICE

(71) Applicant: TOSHIBA MEDICAL SYSTEMS CORPORATION, Otawara-Shi, Tochigi-Ken (JP)

(72) Inventors: Sadanori Tomiha, Nasushiobara (JP); Hiroki Motohashi, Otawara (JP); Manabu Ishii, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1203 days.

This patent is subject to a terminal disclaimer.

(21) Appl. No.: 14/012,274

(22) Filed: Aug. 28, 2013

(65) Prior Publication Data

US 2014/0021956 A1 Jan. 23, 2014

Related U.S. Application Data

(63) Continuation of application No. PCT/JP2013/069741, filed on Jul. 22, 2013.

(30) Foreign Application Priority Data

Jul. 23, 2012 (JP) ................. 2012-162818
Aug. 31, 2012 (JP) ................. 2012-191512

(51) Int. Cl.
*G01R 33/36* (2006.01)
*G01R 33/3415* (2006.01)

(52) U.S. Cl.
CPC ...... *G01R 33/3692* (2013.01); *G01R 33/3415* (2013.01); *G01R 33/3621* (2013.01)

(58) Field of Classification Search
CPC ............ G01R 33/3415; G01R 33/3621; G01R 33/3692

See application file for complete search history.

(56) References Cited

U.S. PATENT DOCUMENTS 7,602,189 B2 * 10/2009 Decke .................. A61B 5/0555
                324/309
7,619,415 B2 * 11/2009 Nakabayashi ... G01R 33/34046
                324/318

(Continued)

FOREIGN PATENT DOCUMENTS

CN 101325427 A 12/2008
CN 102048538 A 5/2011

(Continued)

OTHER PUBLICATIONS

International Preliminary Report on Patentability in PCT/JP2013/069741 dated Jan. 27, 2015 and Form PCT/ISA/237 in PCT/JP2013/069741.

(Continued)

*Primary Examiner* — Dixomara Vargas
(74) *Attorney, Agent, or Firm* — Nixon & Vanderhye P.C.

(57) ABSTRACT

MRI apparatus includes a first radio frequency (RF) communication unit, a second RF communication unit, an image reconstruction unit and a table for loading an object. The first RF communication unit obtains a nuclear magnetic resonance (NMR) signal detected by an RF coil device, and wirelessly transmits a digitized NMR signal via an induced electric field. The second RF communication unit receives the NMR signal via the induced electric field. The image reconstruction unit reconstructs image data based on the NMR signal. The table includes a supporting unit which detachably supports the first RF communication unit to the second radio communication unit so that an interval between (Continued)

the first and second RF communication units enables RF communication via the induced electric field.

20 Claims, 16 Drawing Sheets

(56) References Cited

U.S. PATENT DOCUMENTS

| | | | |
|---|---|---|---|
| 7,696,752 B2* | 4/2010 | Takamori | G01R 33/307 |
| | | | 324/307 |
| 7,714,576 B2* | 5/2010 | Van Den Brink | G01R 33/3415 |
| | | | 324/309 |
| 8,174,264 B2 | 5/2012 | Adachi et al. | |
| 8,188,743 B2* | 5/2012 | Sugiura | G01R 33/3664 |
| | | | 324/309 |
| 8,193,811 B2* | 6/2012 | Tropp | G01R 33/3415 |
| | | | 324/318 |
| 8,217,654 B2* | 7/2012 | Biber | G01R 33/3692 |
| | | | 324/309 |
| 8,502,540 B2* | 8/2013 | Nakanishi | G01R 33/3692 |
| | | | 324/318 |
| 8,754,644 B2* | 6/2014 | Trakic | G01R 33/5659 |
| | | | 324/307 |
| 8,896,309 B2* | 11/2014 | Hahn | G01R 33/34007 |
| | | | 324/309 |
| 8,981,777 B2* | 3/2015 | Biber | G01R 33/3415 |
| | | | 324/318 |
| 9,519,038 B2* | 12/2016 | Okamoto | |
| 9,547,055 B2* | 1/2017 | Biber | G01R 33/3664 |
| 9,687,170 B2* | 6/2017 | Washburn | A61B 5/055 |
| 2008/0311849 A1 | 12/2008 | Washiro | |
| 2009/0237079 A1 | 9/2009 | Van Helvoort et al. | |
| 2011/0101977 A1 | 5/2011 | Nakanishi et al. | |

FOREIGN PATENT DOCUMENTS

| | | |
|---|---|---|
| JP | 2008-312252 | 12/2008 |
| JP | 2009-072580 | 4/2009 |
| JP | 2010-029644 | 2/2010 |
| JP | 2010-147922 | 7/2010 |
| JP | 2011-092553 | 5/2011 |
| JP | 2012-130701 | 7/2012 |

OTHER PUBLICATIONS

International Search Report for PCT/JP2013/069741, dated Aug. 13, 2013.
CN Office Action dated May 6, 2015 in in CN 201380001104.8.

* cited by examiner ously separated in the

MAGNETIC RESONANCE IMAGING APPARATUS, BED DEVICE AND RF COIL DEVICE

This application is a Continuation Application of No. PCT/JP2013/69741, filed on Jul. 22, 2013, and the PCT application is based upon and claims the benefit of priority from Japanese Patent Application No. 2012-162818, filed on Jul. 23, 2012 and Japanese Patent Application No. 2012-191512 filed on Aug. 31, 2012, the entire contents of which are incorporated herein by reference.

BACKGROUND OF THE INVENTION

1. Field of the Invention

Embodiments described herein relate generally to a magnetic resonance imaging apparatus, a bed device and an RF coil device.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

Here, an RF (Radio Frequency) coil device is a device which transmits an RF pulse to nuclear spin inside an object by, for example, supplying a coil with an RF pulse electric current and detects generated MR signals.

Some of RF coil devices are built-in an MRI apparatus and other RF coil devices are recognized by a control unit of the MRI apparatus by being connected to a connection port of the MRI apparatus such as local RF coil devices, for example.

In MRI, multi-channel structure is promoted in acquisition system of MR signals. The above "channel" means each pathway of a plurality of MR signals outputted from each coil element and inputted to an RF receiver of an MRI apparatus. Although the number of channels is set to equal to or smaller than the input reception number of the RF receiver, a large number of RF coil devices can be connected to an MRI apparatus.

If the number of cables between an RF coil device and an MRI apparatus increases due to promotion of the aforementioned multichannel structure, it is inconvenient because hard-wiring becomes complicated.

Therefore, it is desired to unwire transmission and reception of signals between an RF coil device and an MRI apparatus. However, radio communication by an analogue signal has not been achieved, because there are various restrictions such as degradation of dynamic range.

More specifically, in order to suppress influence on receiving sensitivity to weak MR signals emitted from an object, it is impossible in an MRI apparatus to enlarge the output of electromagnetic waves used for radio communication between an RF coil device and an MRI apparatus.

If it is impossible to enlarge the radio output power, dynamic range degrades due to signal loss caused when transmitted signals travel space. Then, in Japanese Patent Application Laid-open (KOKAI) Publication No. 2010-29664, "digital radio communication method in which MR signals are digitized and then transmitted wirelessly" is proposed.

Although the problem of restriction of dynamic range can be solved by wirelessly transmitting MR signals after digitalization, this method has the following problems.

Firstly, regulation of radio communication is different from country to country, and the same transmission frequency or the same transmission power cannot be necessarily used in other countries.

Secondly, if MR signals are wirelessly transmitted from an RF coil device to an MRI apparatus, the transmitted radiowaves are reflected off surrounding areas and this degrades the data being conveyed by radio communication.

Therefore, novel technology to wirelessly transmit digitized MR signals from an RF coil device to an MRI apparatus satisfactorily has been desired in MRI.

DETAILED DESCRIPTION

Figure 1:
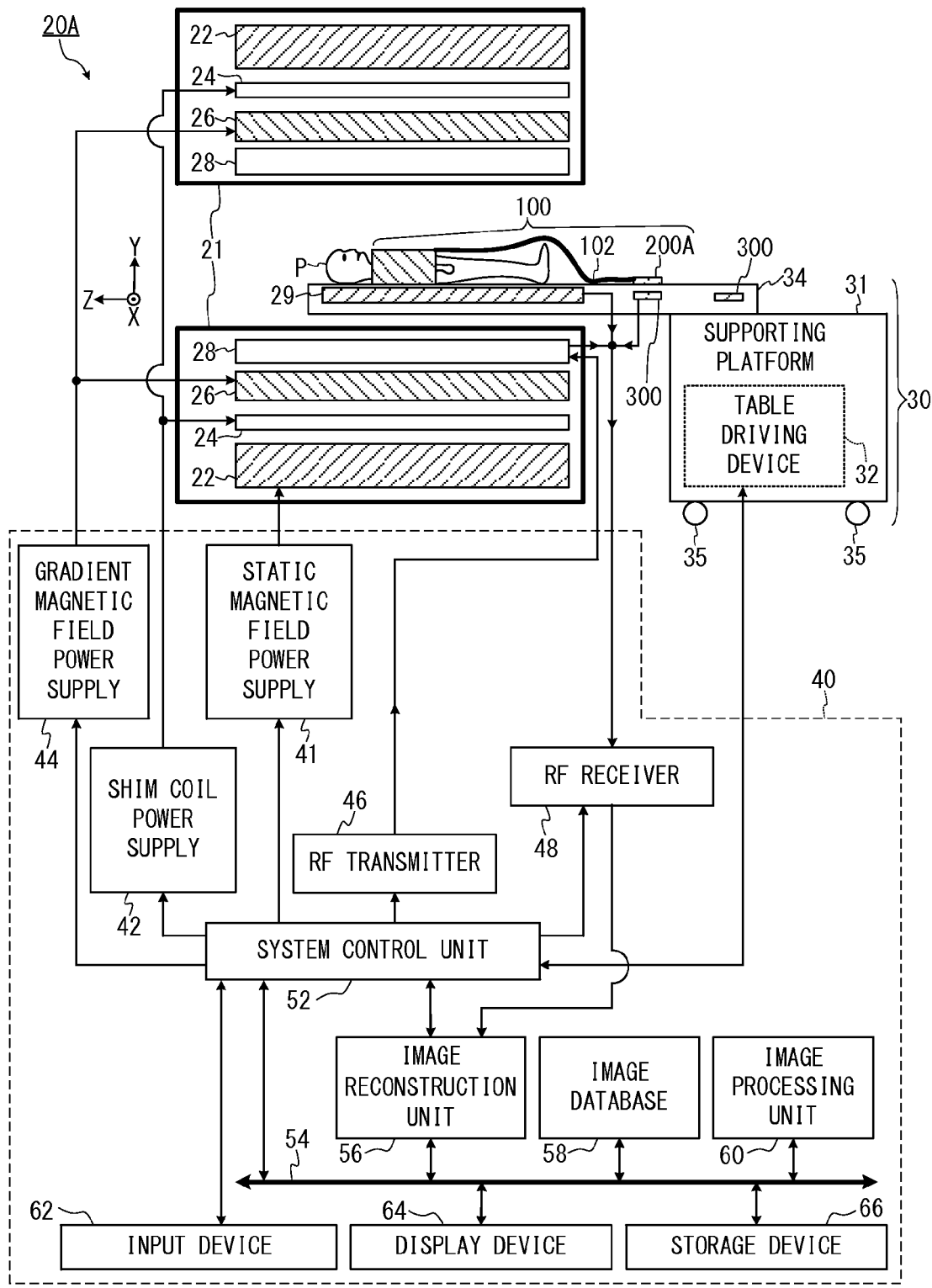
FIG. 1 is a block diagram showing general structure of the MRI apparatus of the first embodiment.

In the following embodiments, a first radio communication unit and a second radio communication unit both of which are capable of radio communication via an induced electric field are arranged on an RF coil device side and on a control side of an MRI apparatus respectively. In this case, the first radio communication unit and the second radio communication unit are fixed to each other within near distance, for example, and digitized MR signals are wirelessly transmitted from the first radio communication unit to the second radio communication unit via an induced electric field.

The aforementioned purpose of wirelessly transmitting digitized MR signals from an RF coil device to an MRI apparatus satisfactorily can be achieved by the above novel technology.

Here, if the imaging time becomes longer, there is a possibility that the RF coil device set on an object P moves due to movement of the object P during imaging. This is because the transmission span of the MR signals becomes longer as the imaging time becomes longer. In this case, it is desirable in the above structure to resolve the problem that the first radio communication device is moved by the movement of the RF coil device and the MR signals detected from the object P cannot be transmitted, by a more secure fixing method.

Then, in the following embodiments of the present invention, it is a further assignment to prevent communication failure caused by a human error such as the above example by fixing the first radio communication unit to the second radio communication unit with a more secure method.

Hereinafter, examples of aspects which embodiments of the present invention can take will be explained per aspect.

(1) According to one embodiment, an MRI apparatus acquires an MR signal from an RF coil device that detects the MR signal emitted from an object, and this MRI apparatus includes a first radio communication unit, a second radio communication unit, an image reconstruction unit and a table.

The first radio communication unit acquires the MR signal detected by the RF coil device, and wirelessly transmits the digitized MR signal via an induced electric field.

The second radio communication unit receives the MR signal wirelessly transmitted from the first radio communication unit via the induced electric field.

The image reconstruction unit reconstructs image data of the object based on the MR signal received by the second radio communication unit.

The table for loading the object includes a supporting unit. The supporting unit detachably supports the first radio communication unit to the second radio communication unit, in such a manner that the interval between the first radio communication unit and the second radio communication unit becomes an interval capable of the radio communication via the induced electric field.

(2) According to one embodiment, a bed device includes a table for loading an object and receives a nuclear magnetic resonance signal detected by an RF coil device during implementation term of magnetic resonance imaging. In this bed device, the table includes a signal acquisition unit and a supporting unit.

The signal acquisition unit receives a digitized nuclear magnetic resonance signal wirelessly transmitted from a radio communication unit of the RF coil device, via an induced electric field.

The supporting unit supports the radio communication unit onto the signal acquisition unit in such a manner that an interval between the radio communication unit and the signal acquisition unit enables the radio communication via the induced electric field.

(3) According to one embodiment, an RF coil device includes a detecting unit, an A/D conversion unit and a radio communication unit.

The detecting unit detects an MR signal emitted from an object.

The A/D conversion unit digitizes the MR signal detected by the detecting unit.

The radio communication unit is supported by a supporting unit of a magnetic resonance imaging apparatus. The radio communication unit wirelessly transmits the nuclear magnetic resonance signal digitized by the A/D conversion unit via an induced electric field when the radio communication unit is supported by the supporting unit.

Examples of embodiments of a magnetic resonance imaging apparatus, an bed device, an RF coil device and a magnetic resonance imaging method to which the aforementioned configuration is applied will be concretely described with reference to the accompanying drawings as follows.

Note that the same reference numbers are given for identical components in each figure, and overlapping explanation is abbreviated.

The First Embodiment

FIG. 1 is a block diagram showing an example of general structure of the MRI apparatus 20A according to the first embodiment. As shown in FIG. 1, the MRI apparatus 20A includes a gantry 21, a bed 32 and a bed device 30 and a control device 40.

Additionally, the MRI apparatus 20A includes a static magnetic field magnet 22, a shim coil 24, a gradient magnetic field coil 26 and a transmission RF coil 28, in the gantry 21 which is cylinder-shaped as an example. The gantry 21 corresponds to the parts indicated as thick line frames in FIG. 1.

The bed device 30 includes a supporting platform 31, a table driving device 32 disposed in the supporting platform 31 and a table 34.

As an example here, the bed device 30 is a (movable) dockable type, and includes a connecting unit (not shown). The bed device 30 is connected to the gantry 21 via the connecting unit, and receives a control signal from the control device 40 via the connecting unit.

The supporting platform 31 supports table 34 in such a manner that table 34 is movable in the horizontal direction (the Y axis direction in the apparatus coordinate system). In addition, the supporting platform 31 includes, for example, four casters on its bottom aspect, and thus the bed device 30 can move to an imaging room after loading a patient on the table 34 in another room and dock with the gantry 21 in the imaging room. In order for the bed device 30 to be movable, the number of the casters is desirably equal to or more than three. Note that, the bed device 30 is not limited to a dockable type and may be another type whose supporting platform is fixed in the imaging room in terms of position.

An object P is loaded on the table 34. The static magnetic field magnet 22 and the shim coil 24 are, for example, cylinder-shaped. Inside the static magnetic field magnet 22, the shim coil 24 is coaxially arranged with the static magnetic field magnet 22.

As an example here, an apparatus coordinate system, whose X axis, Y axis and Z axis are perpendicular to each other, is defined as follows.

Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction.

Moreover, the table 34 is disposed in such a position that the direction of "the normal line of the loading plane thereof on which the object P is put" is the same as the Y axis direction.

In the following explanation it is assumed that the X axis, the Y axis and the Z axis means those in the apparatus coordinate system, unless otherwise noted.

The control device 40 of the MRI apparatus 20A includes a static magnetic field power supply 41, a shim coil power supply 42, a gradient magnetic field power supply 44, an RF transmitter 46, an RF receiver 48, a system control unit 52, a system bus 54, an image reconstruction unit 56, an image database 58, an image processing unit 60, an input device 62, a display device 64 and a storage device 66.

The static magnetic field magnet 22 forms a static magnetic field in an imaging space by using electric current supplied from the static magnetic field power supply 41.

The aforementioned "imaging space" means, for example, a space in the gantry 21 in which the object P is placed and to which a static magnetic field is applied.

The static magnetic field magnet 22 includes a superconductivity coil in many cases. The static magnetic field magnet 22 gets electric current from the static magnetic field power supply 41 at excitation. However, once excitation has been made, the static magnetic field magnet 22 is usually isolated from the static magnetic field power supply 41. Note that, the static magnetic field magnet 22 may include a permanent magnet which makes the static magnetic field power supply 41 unnecessary.

The shim coil 24 is electrically connected to the shim coil power supply 42 and uniforms the static magnetic field with the electric current supplied from the shim coil power supply 42.

The gradient magnetic field coil 26 is, for example, arranged in the form of a cylinder inside the static magnetic field magnet 22. The gradient magnetic field coil 26 generates a gradient magnetic field Gx in the X axis direction, a gradient magnetic field Gy in the Y axis direction and a gradient magnetic field Gz in the Z axis direction in the imaging region, by using electric current supplied from the gradient magnetic field power supply 44.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axes, by combining the gradient magnetic fields Gx, Gy and Gz in the three axes of the apparatus coordinate system.

Note that, the above imaging region means, for example, a region set as a part of the imaging space and is a range of acquisition of MR signals used to generate one image or one set of image. Here, one set of images means, for example, a plurality of images when MR signals of the plurality of images are acquired in a lump in one pulse sequence such as multi-slice imaging. The imaging region is defined three-dimensionally in the apparatus coordinate system, for example.

The RF transmitter 46 generates RF pulses in accordance with control information provided from the system control unit 52, and transmits the generated RF pulses to the transmission RF coil 28.

The transmission RF coil 28 transmits RF pulses given from the RF transmitter 46 to the object P. Note that, the transmission RF coil 28 includes a whole body coil (not shown) which is built-in the gantry 21 and used for both transmission of RF pulses and detection of MR signals.

A reception RF coil 29 is disposed inside the table 34. The reception RF coil 29 detects MR signals generated due to excited nuclear spin inside the object P by the RF pulse, and transmits the detected MR signals to the RF receiver 48.

The RF coil device 100 is, for example, a wearable local RF coil device for detecting MR signals. Here, the RF coil device 100 which is set on the chest part and detects MR signals from the chest part is shown, but this is only an example. In the MRI apparatus 20A, various wearable RF coil devices such as a shoulder RF coil device and a lumbar part RF coil device can be used for detection of MR signals aside from the RF coil device 100.

As an example here, each of these RF coil devices (100) for detecting the MR signals is interpreted as a part of the MRI apparatus 20A. However, these RF coil devices may be interpreted as separated components from the MRI apparatus 20A. The RF coil device 100 includes a cable 102 and a coil side radio communication device 200A connected to the end of the cable 102.

Inside the table 34, a plurality of control side radio communication devices 300 are arranged. The aforementioned radio communication of the digitized MR signals is performed between one coil side radio communication device 200A and one of the control side radio communication devices 300.

However, the present embodiment is not limited to the aforementioned aspect, in the case of setting a plurality of RF coil devices on the object P as an example. In this case, the radio communication of the digitized MR signals are respectively performed between each of the coil side radio communication devices 200A respectively corresponding to the plurality of the RF coil devices and each of the control side radio communication devices 300 respectively corresponding to the coil side radio communication devices 200A. Operation of the radio communication will be described later.

Note that, though only two of the control side radio communication devices 300 are shown in FIG. 1 to avoid complication, the number of the control side radio communication devices 300 may be one or more than two.

However, configuration of including many of the separately arranged control side radio communication devices 300 is more preferable than configuration of including only one control side radio communication device 300. This is because the former has more choices to closely fix the coil side radio communication device 200A to the control side radio communication device 300.

In other words, if there are more choices of a fixing position, the coil side radio communication device 200A can be fixed to the control side radio communication device 300 which is the nearest to the RF coil device 100. If it is fixed in such a manner, the cable 102 between the RF coil device 100 and the coil side radio communication device 200A can be shortened.

Note that, the aforementioned closely fix means, for example, to fix mutually immovably within a range (distance) of being mutually electromagnetically coupled so as to be capable of radio communication via an induced electric field.

In addition, as an example in the present embodiment, transmission of an RF pulse to the transmission RF coil 28 inside the MRI apparatus 20A and transmission of MR signals detected from the object P are performed under wire transmission except the pathway between the coil side radio communication device 200A and the control side radio communication devices 300.

The RF receiver 48 generates complex number data of digitized MR signals (hereinafter, referred to as raw data of MR signals) by performing predetermined signal processing. The RF receiver 48 inputs the generated raw data of MR signals to the image reconstruction unit 56.

The system control unit 52 performs system control of the entirety of the MRI apparatus 20A in imaging operation and image display after imaging operation via interconnection lines such as the system bus 54.

For achieving the above control, the system control unit 52 stores control information needed in order to make the gradient magnetic field power supply 44, the RF transmitter 46 and the RF receiver 48 drive. The aforementioned control information includes, for example, sequence information describing operation control information such as intensity, application period and application timing of the pulse electric currents which should be applied to the gradient magnetic field power supply 44.

The system control unit 52 generates the gradient magnetic fields Gx, Gy and Gz and RF pulses by driving the gradient magnetic field power supply 44, the RF transmitter 46 and the RF receiver 48 according to a predetermined sequence stored.

Additionally, the system control unit 52 makes the table 34 move into and out of the imaging space in the gantry 21 in the Z axis direction by controlling the table driving device 32. Additionally, the system control unit 52 can control the table driving device 32 so as to move up and down the table 34 in the Y axis direction by changing the height of the supporting platform 31. The system control unit 52 locates the imaging part of the object P near to the center of the magnetic field in the imaging space by controlling the position of the table 34 in the above manner.

Additionally, the system control unit 52 functions as an imaging condition setting unit. That is, the system control unit 52 sets the imaging conditions of the main scan based on some of the imaging conditions and information inputted to the input device 62 by a user. For achieving this, the system control unit 52 makes the display device 64 display screen information for setting imaging conditions.

The input device 62 provides a user with a function to set imaging conditions and image processing conditions.

The aforementioned term imaging condition refers to under what condition an RF pulse or the like is transmitted in what type of pulse sequence, or under what condition MR signals are acquired from the object P, for example.

As a parameter of the imaging conditions, for example, there are the imaging region as positional information in the imaging space, an imaging part, the type of the pulse sequence such as parallel imaging, the type of RF coil devices used for imaging, the number of slices, an interval between respective slices.

The above imaging part means a region of the object P to be imaged as an imaging region, such as a head, a chest and an abdomen.

The aforementioned main scan is a scan for imaging an intended diagnosis image such as a proton density weighted image, and it does not include a scan for acquiring MR signals for a scout image or a calibration scan. A scan is an operation of acquiring MR signals, and it does not include image reconstruction processing.

The calibration scan is a scan for determining unconfirmed elements of imaging conditions, conditions and data used for image reconstruction processing and so on, and it is performed separately from the main scan. The aftermentioned prescan is a calibration scan which is performed before the main scan.

The image reconstruction unit 56 converts the raw data of MR signals inputted from the RF receiver 48 into, for example, matrix data based on a phase encode step number and a frequency encode step number, and stores the converted data as k-space data. The k-space means a frequency space (Fourier space).

The image reconstruction unit 56 generates image data of the object P by performing image reconstruction processing including such as two-dimensional Fourier transformation on the k-space data. The image reconstruction unit 56 stores the generated image data in the image database 58.

The image processing unit 60 takes in the image data from the image database 58, performs predetermined image processing on them, and stores the image data after the image processing in the storage device 66 as display image data.

The storage device 66 stores the display image data after adding accompanying information such as imaging conditions used for generating the display image data and information of the object P (patient information) to the display image data.

The display device 64 displays a screen for setting imaging conditions of the main scan and images indicated by generated image data under control of the system control unit 52.

Note that, though components of the MRI apparatus 20A are classified into three as the gantry 21, the bed device 30 and the control device 40 in the above explanation, it is only an example of interpretation. For example, the table driving device 32 may be interpreted as a part of the control device 40.

Figure 2:
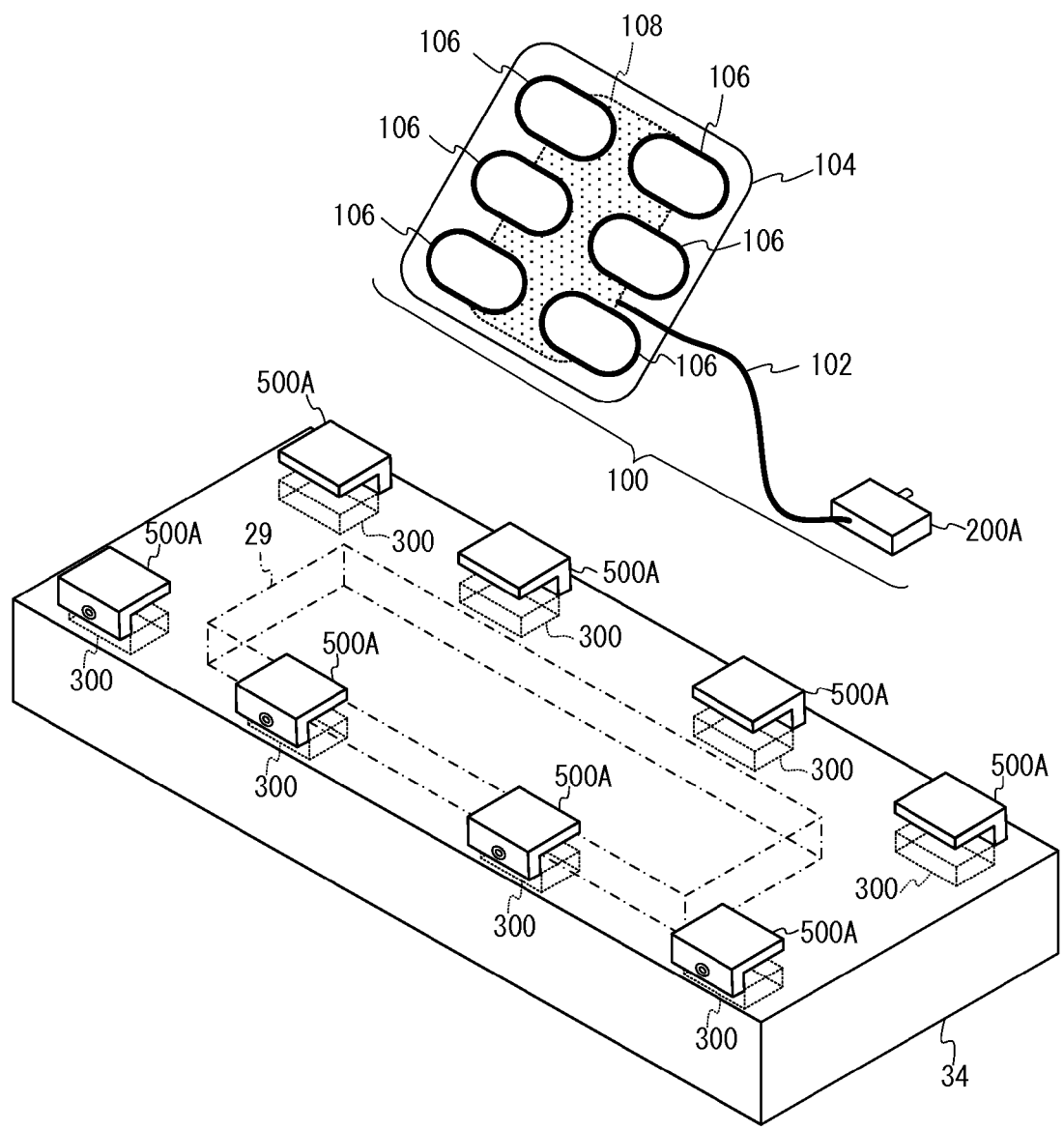
FIG. 2 is a schematic diagram showing an example of structure of an RF coil device, an example of arrangement of control side radio communication devices, and an example of fixing methods of a coil side radio communication device in the first embodiment.

FIG. 2 is a schematic diagram showing an example of the structure of the RF coil device 100, an example of arrangement of the control side radio communication devices 300, and an example of fixing methods of the coil side radio communication device 200A in the first embodiment.

As shown in FIG. 2, the RF coil device 100 includes the cable 102, a cover member 104 and the aforementioned coil side radio communication device 200A. The cover member 104 is made of a flexible material and is capable of deformation such as folding. As such a deformable (flexible) material, for example, a flexible circuit board (Flexible Printed Circuit: FPC) described in Japanese Patent Application Laid-open (KOKAI) Publication No. 2007-229004 can be used.

Inside the cover member 104, a plurality of coil elements (surface coils) 106 functioning as antennas which respectively detect MR signals from the object P are disposed. Although six coil elements 106 are shown in FIG. 2 as an example here, the number or shape of the coil elements 106 are not limited to the shown number or shape.

Additionally, inside the cover member 104, the RF coil device 100 includes a control circuit 108 which controls the operation of the RF coil device 100. Although there are other components such as A/D (analog to digital) converter 212 inside the cover member 104, their details will be described later with FIG. 6.

As an example here, the coil side radio communication device 200A is assumed to be a part of the RF coil device 100, but this is only an example of interpretation. The RF coil device 100 and the coil side radio communication device 200A may be interpreted as mutually separate components.

The cable 102 is connected to the coil side radio communication device 200A of the MRI apparatus 20A on its one end, and is connected to the control circuit 108 and so on inside the cover member 104 on its one end.

Additionally, inside the cover member 104 of the RF coil device 100, components such as preamplifiers PMP (see after-mentioned FIG. 6) for amplifying the MR signals detected by the coil elements 106 and bandpass filters for filtering may be disposed.

As an example here, eight of the control side radio communication devices 300 are arranged immediately beneath the surface of the table 34 on which the object P is loaded (hereinafter, this surface is referred to as the top surface of the table 34).

The object P is, for example, loaded in the middle of the width direction (the X axis direction in FIG. 1) of the table 34. Thus, in this example, on both end sides in the width direction of the table 34, four of the control side radio communication devices 300 are respectively arranged along the longer direction of the table 34 (the Z axis direction) in a row at intervals.

Note that, the number or arrangement position of the control side radio communication devices 300 is not limited to that of FIG. 2 (inside the table 34). For example, the control side radio communication devices 300 may be disposed and exposed on the table 34 or on the gantry 21. Alternatively, the control side radio communication devices 300 may be disposed inside the gantry 21 or on the supporting platform 31.

However, as an example in the following embodiments, an example in which the fixing structures 500A to 500E fixing the coil side radio communication device (200A to 200E) will explained, and it is assumed that the control side radio communication devices 300 are disposed inside the table 34.

In the first embodiment, the table 34 includes eight of the fixing structures 500A fixed on its top surface. Each supporting member 502a (see FIG. 3) of the eight fixing structures 500A are fixed to such positions that the fixing structures 500A respectively face the eight control side radio communication devices 300 in the thickness direction of the table 34. As to the fixing method, for example, bonding may be used. Alternatively, the fixing structures 500A may be integrally formed as a part of the top surface of the table 34, by using the same material as the top surface.

Figure 3:
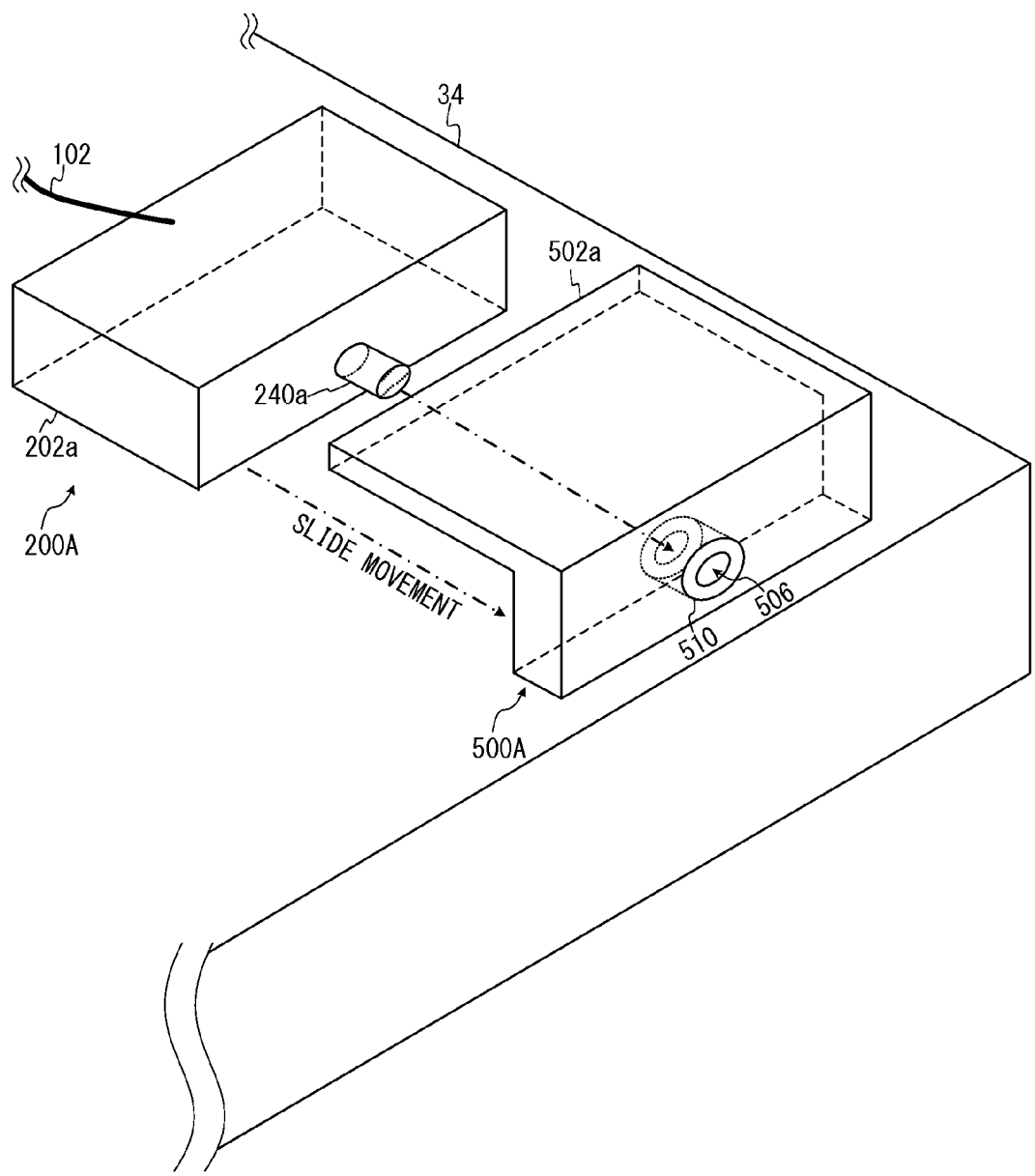
FIG. 3 is a schematic oblique drawing showing an overview of the state in which the coil side radio communication device and the fixing structure are mutually separated in the first embodiment.

FIG. 3 is a schematic oblique drawing showing an overview of the state in which the coil side radio communication device 200A and the fixing structure 500A are mutually separated in the first embodiment. As shown in FIG. 3, the fixing structure 500A includes a supporting member 502a and an elastic member 510 covering an insertion hole 506 formed on the supporting member 502a.

The coil side radio communication device 200A includes a chassis 202a and a columnar jut 240a. As an example here, the jut 240a is disposed on the center of the surface opposite to the surface to which the cable 102 is connected of the chassis 202a. This is so that the jut 240a can be easily interdigitated with the insertion hole 506 by sliding the coil side radio communication device 200A on the top surface of the table 34.

The supporting member 502a of the fixing structure 500A has a shape obtained by bending a flat plate made of undeformable nonmagnetic material, and its transverse section is L-letter shape. Note that, influence on radio communication via an induced electric field can be avoided by forming the fixing structure 500A with nonmagnetic material. In the supporting member 502a, the insertion hole 506 is formed on the surface which is in parallel with the thickness direction of the table 34. The aperture of the insertion hole 506 is circular. The diameter and depth of the insertion hole 506 are such dimensions that the insertion hole 506 interdigitate the jut 240a. The surrounding region of the insertion hole 506 is formed as the elastic member 510 having elasticity such as rubber. As an example here, the elastic member 510 is cylinder-shaped and can be made of, for example, silicone rubber, polyethylene or synthetic resin.

Figure 4:
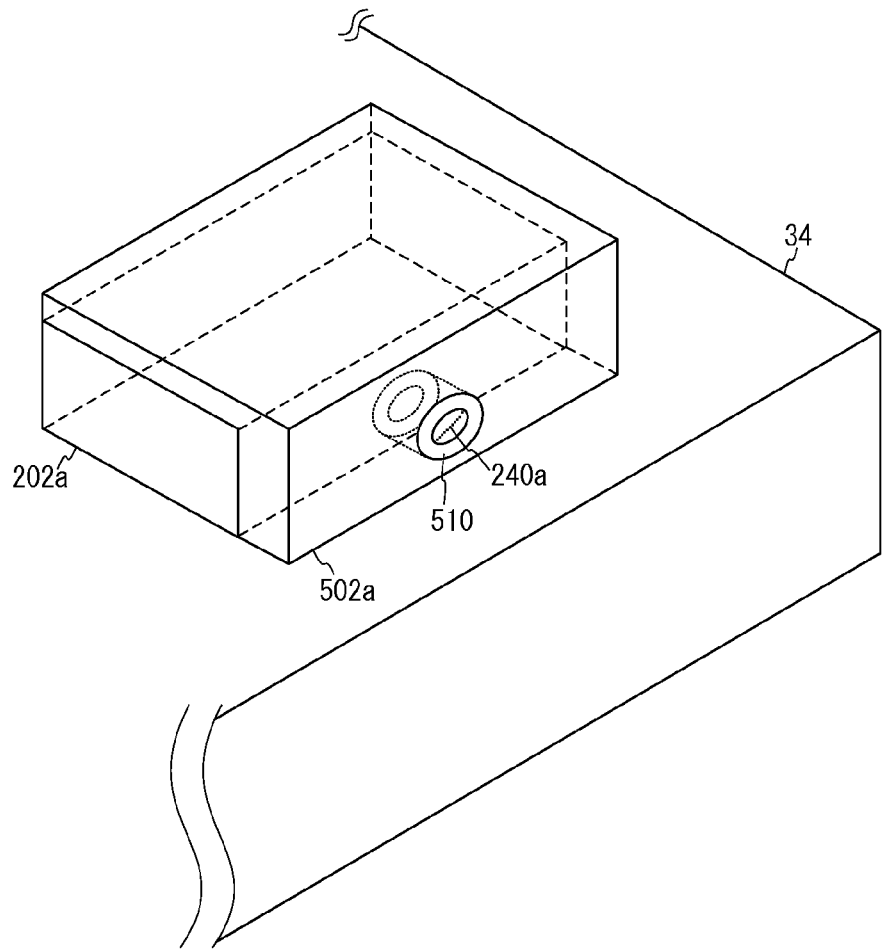
FIG. 4 is a schematic oblique drawing showing an overview of the state in which the coil side radio communication device is fixed by the fixing structure in the first embodiment.

FIG. 4 is a schematic oblique drawing showing an overview of the state in which the coil side radio communication device 200A is fixed by the fixing structure 500A in the first embodiment.

The coil side radio communication device 200A can be interdigitated with the fixing structure 500A by sliding it from the state in which the coil side radio communication device 200A is placed on the top surface of the table 34. That is, as shown in FIG. 4, the coil side radio communication device 200A and the fixing structure 500A are interdigitated with each other in such a manner that the jut 240a is interdigitated with the insertion hole 506, and thereby the coil side radio communication device 200A is unfailingly fixed on the table 34 by the frictional force of the elastic member 510.

Figure 5:
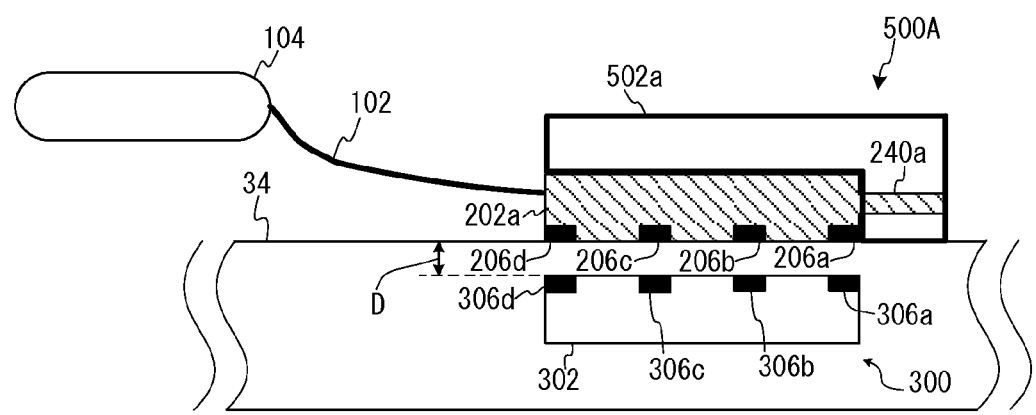
FIG. 5 is a schematic cross-sectional diagram showing a state in which the coil side radio communication device is fixed by the fixing structure in the first embodiment.

FIG. 5 is a schematic cross-sectional diagram showing a state in which the coil side radio communication device 200A is fixed by the fixing structure 500A in the first embodiment.

As shown in FIG. 5, the coil side radio communication device 200A includes antennas 206a, 206b, 206c and 206d in its chassis 202a. Inside the chassis 202a, the antennas 206a to 206d are disposed on the side of its rear surface (the downside surface in FIG. 3) which becomes the table 34 side in the case of being fixed by the fixing structure 500A.

A control circuit (not shown) inside the chassis 202a is connected to the control circuit 108 and so on of the cover member 104 of the RF coil device 100 via the cable 102.

The control side radio communication device 300 includes a chassis 302 and antennas 306a, 306b, 306c and 306d. Although other components such as a reference signal transmitting unit are included inside the chassis 302, their details will be described later with FIG. 6. Inside the chassis 302, the antennas 306a to 306d are disposed on the side of the top surface (the side of the top surface of the table 34).

Each of the antennas 306a to 306d corresponds to each of the above antennas 206a to 206d so as to group into a pair (totally, four pairs). Out of the antennas 206a to 206d and 306a to 306d, at least the pathway between the antennas 206a and 306a is composed of, for example, later-described induced electric field combined couplers.

In this example, the control side radio communication device 300 is fixed to inside of the table 34 and is immovable. Additionally, the fixing structure 500A is fixed to the top surface of the table 34 and is immovable. Thus, the coil side radio communication device 200A is detachably fixed to a position where it faces the control side radio communication devices 300, by the fixing structure 500A set on the table 34.

Additionally, the antennas 206a to 206d are disposed so as to face the antennas 306a to 306d respectively, when the coil side radio communication device 200A is fixed by the fixing structure 500A so as to face the control side radio communication device 300.

Here, a plurality of the control side radio communication devices 300 are discretely arranged in the table 34. Thus, no matter which part of the object P the RF coil device 100 is set on, the coil side radio communication device 200A can be closely fixed to the nearest control side radio communication device 300. Although the first embodiment refers to the RF coil device 100 for the chest part, the above point is true for the combination of an RF coil devices for another part and the coil side radio communication device 200A. Thus, the length of the cable 102 can be shortened.

The short-distance radio communication via an induced electric field is performed on the pathway between the coil side radio communication device 200A and the control side radio communication device 300. An induced electric field means an electric field caused by time change of magnetic flux density. As short-distance radio communication via an induced electric field, for example, TransferJet (Trademark) which uses an induced electric field combined coupler as an antenna can be used (see Japanese Patent Application Laid-open (KOKAI) Publication No. 2010-147922, for example).

More specifically, the induced electric field combined coupler includes a coupling electrode, a resonance stub, a ground and so on (not shown). If an electric signal is inputted to the resonance stub of the transmission side, electric charges are accumulated in the coupling electrode, and virtual electric charges equal to the electric charges accumulated in the coupling electrode are generated in the ground. Thereby, a micro electrical dipole is composed by these electric charges, and this micro electrical dipole functions as a transmission side antenna. That is, data are transmitted to the receiving side via an induced electric field of a longitudinal wave generated by the micro electrical dipole. Because a longitudinal wave vibrating in parallel with the traveling direction is not influenced by the direction of an antenna, stable data transmission can be achieved.

However, if the receiving side is separated from the transmission side beyond limit, both sides are not electromagnetically coupled and data transmission cannot be achieved. This is because induced electric fields formed by the induced electric field combined couplers rapidly attenuate if the interval between both sides of the couplers becomes distant.

Although the antennas 206a to 206d are discretely disposed and the antennas 306a to 306d are discretely disposed in order to distinguish respective components in FIG. 5, interference between each of the four radio communication pathway can be avoided without arranging them separately. That is, the four radio frequencies respectively used in the pathway of the antennas 206a to 306, the pathway of the antennas 206b to 306b, the pathway of the antennas 206c to 306c and the pathway of the antennas 206d to 306d may be separated (their frequency values may be widely set apart). As to the radio communication frequency, it is preferable to avoid frequencies which are equal to numbers obtained by dividing a center frequency of RF pulses transmitted to the object P by a natural number, in each of the radio communication pathway.

It is preferable that installation positions of the control side radio communication devices 300 are not too deep from the top surface of the table 34. If positions of the antennas 306a to 306d of each of the control side radio communication devices 300 in the table 34 are too deep, the interval D (see FIG. 5) between the transmission side and the receiving side cannot be close enough to electro-magnetically couple the antennas 206a to 206d of the transmission side with the antennas 306a to 306d of the receiving side. In this case, the radio communication via an induced electric field will be difficult to achieve.

That is, it is preferable to dispose each of the control side radio communication devices 300 to such a position that the coil side radio communication device 200A can be closely fixed so as to be electro-magnetically coupled with the control side radio communication device 300.

Note that, as long as an electric dipole (antenna) of the coil side radio communication device 200A side is not directly contacted to an electric dipole (antenna) of the control side radio communication device 300 side, the chassis covering the antennas of the coil side radio communication device 200A side may be contacted to the chassis covering the antennas of the control side radio communication device 300 side. This is because it is enough if the interval D causing an induced electric field is kept between the antennas of the transmission side and the antennas of the receiving side. Thus, the surface of the antenna side of the control side radio communication devices 300 may be exposed so as to become in line with the top surface of the table 34.

Figure 6:
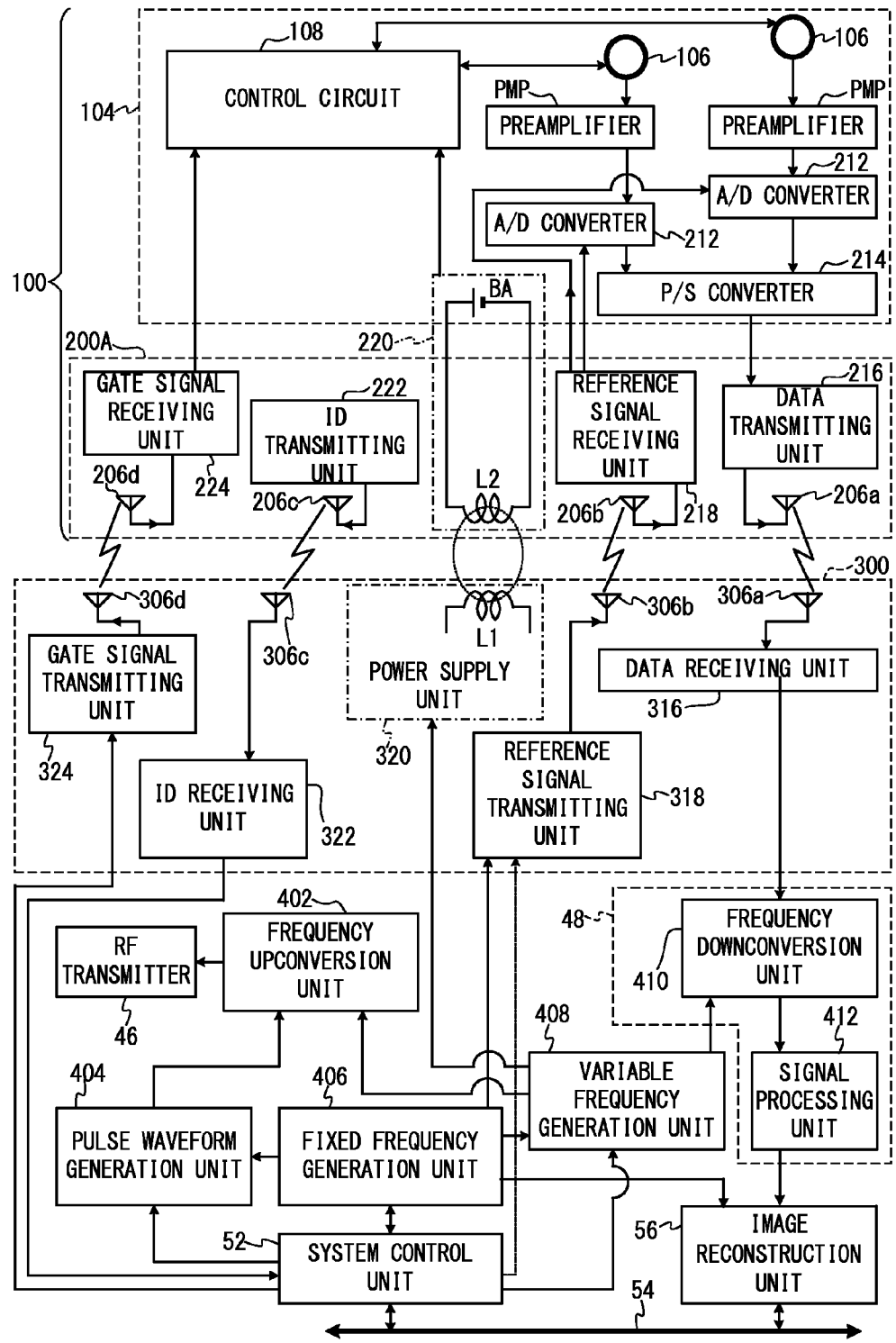
FIG. 6 is a schematic block diagram showing the functions of the respective units relevant to transmission of the MR signals detected by the coil elements of the RF coil device in the first embodiment.

FIG. 6 is a schematic block diagram showing the functions of the respective units relevant to transmission of the MR signals detected by the coil elements 106 of the RF coil device 100 in the first embodiment.

As shown in FIG. 6, inside the cover member 104 of the RF coil device 100, the aforementioned control circuit 108, the aforementioned coil elements 106, a plurality of preamplifiers PMP respectively corresponding to the coil elements 106, a plurality of A/D converters 212 respectively corresponding to the coil elements 106, a P/S (Parallel/Serial) converter 214 and a rechargeable battery BA are disposed.

The coil side radio communication device 200A further includes a data transmitting unit 216, a reference signal receiving unit 218, an ID (Identification Information) transmitting unit 222, a gate signal receiving unit 224 and a coil L2, in addition to the aforementioned antennas 206a to 206d.

In FIG. 6, hard-wiring between the gate signal receiving unit 224 and the control circuit 108, hard-wiring between the coil L2 and the rechargeable battery BA, hard-wiring between the reference signal receiving unit 218 and each of the A/D converters 212, hard-wiring between the P/S converter 214 and the data transmitting unit 216 and so on are included in the cable 102 (see FIG. 2). In order to avoid complication, the cable 102 is not shown in FIG. 6.

Additionally, the power receiving unit 220 is composed of the coil L2 inside the coil side radio communication device 200A and the rechargeable battery BA inside the cover member 104.

The control side radio communication device 300 further includes a data receiving unit 316, a reference signal transmitting unit 318, a power supply unit 320, an ID (Identification Information) receiving unit 322 and a gate signal transmitting unit 324, in addition to the aforementioned antennas 306a to 306d. Additionally, the power supply unit 320 includes a coil L1.

Additionally, the control device 40 of the MRI apparatus 20A further includes a frequency upconversion unit 402, a pulse waveform generation unit 404, a fixed frequency generation unit 406, a variable frequency generation unit 408, aside from the components shown in FIG. 1. Additionally, the RF receiver 48 includes a frequency downconversion unit 410 and a signal processing unit 412.

As an example in the first embodiment, there are a region where an induced magnetic field for charging is generated and four radio communication pathways between the coil side radio communication device 200A and the control side radio communication device 300. In the following, the above region and pathways will be explained in order.

Consider a case where the coil L2 of the power receiving unit 220 is located in a position close enough to be electromagnetically coupled to the coil L1 of the power supply unit 320 (i.e. a case where the coil side radio communication device 200A is closely fixed to the control side radio communication device 300 by the fixing structure 500A). In this case, the power supply unit 320 supplies a primary current to the coil L1 so as to generate an induced magnetic field, and thereby electromotive force is caused in the coil L2. By this electromotive force, a secondary current flows the coil L2, and thereby the rechargeable battery BA is charged.

The power receiving unit 220 provides the electric power charged in the above manner to each component inside the coil side radio communication device 200A and each component inside the cover member 104 via hard-wiring (not shown). Here, as to the frequency of the primary current supplied to the coil L1, it is preferable to separate the frequency from each communication frequency used in the four radio communication pathways. This is so that signals in the four radio communication pathways between the antennas 206a to 206d and the antennas 306a to 306d are not interfered by the above primary current.

As a method of saving electric power of the RF coil device 100, instead of the power receiving unit 220 and the power supply unit 320, a rechargeable battery may be embedded in the RF coil device 100 and this rechargeable battery may be charged during unused span of the RF coil device 100. Alternatively, a rechargeable battery charged during unused span of the RF coil device 100 and the above power receiving unit 220 and the power supply unit 320 may be used in combination.

Next, the four radio communication pathways will be explained. Although the radio communication via an induced electric field is performed at least in the pathway between the antennas 206a and 306a, it may be performed in the pathway between the antennas 206b and 306, or the pathway between the antennas 206d and 306d.

Firstly, in the pathway between the antennas 206c and 306c, the identification information of the RF coil device 100 is transmitted from the coil side radio communication device 200A to the control side radio communication device 300.

More specifically, for example, the above identification information is preliminarily stored in the ID transmitting unit 222. Note that, the identification information may be inputted from the control circuit 108 to the ID transmitting unit 222 via the cable 102. If the antenna 306c of the ID receiving unit 322 comes close to the antenna 206c of the ID transmitting unit 222, the ID transmitting unit 222 operates by using electric power supplied from the ID receiving unit 322. That is, the ID transmitting unit 222 automatically transmits the identification information as a digital signal from the antenna 206c to the antenna 306c. This radio communication of the identification information may be performed in the same way as RFID (Radio Frequency Identification) typified by, for example, IC (Integrated Circuit) tag.

The ID receiving unit 322 inputs the identification information of the RF coil device 100 received by the antenna 306c to the system control unit 52. Thereby, the system control unit 52 recognizes information on which of various types of RF coil devices such as the chest part RF coil device and the shoulder RF coil device is(are) currently connected.

Secondly, in the pathway between the antennas 306d and 206d, a gate signal is continuously wirelessly transmitted from the gate signal transmitting unit 324 of the control side radio communication device 300 to the gate signal receiving unit 224 of the coil side radio communication device 200A during imaging.

More specifically, as a switch changing on-off state of each coil element 106 of the RF coil device 100, for example, a trap circuit including a PIN diode (p-intrinsic-n Diode) and so on are used. The gate signal is a control signal of the above switch.

Note that, as an alternative configuration, a trigger signal may be transmitted from the gate signal transmitting unit 324 to the gate signal receiving unit 224 and the gate signal is generated inside the gate signal receiving unit 224 based on the trigger signal.

While RF pulses are transmitted to the object P, the gate signal inputted to the RF coil device 100 via the gate signal transmitting unit 324, the antenna 306d, the antenna 206d and the gate signal receiving unit 224 is generally set to on-level. During the on-level span of the gate signal, the above switch becomes off state so as to disconnect the loop of each of the coil elements 106 and thereby each of the coil elements 106 cannot detect MR signals.

Except the span during which RF pulses are transmitted to the object P, the gate signal adjusted to off-level is wirelessly transmitted. While the gate signal is off-level, the above switch becomes on-state and each of the coil elements 106 can detect MR signals. Coupling effect between the transmission RF coil 28 which transmits RF pulses to the object P and the coil elements 106 which respectively detect the MR signals from the object P is prevented by the above on/off switching of the coil elements 106.

Thirdly, in the pathway between the antennas 306b and 206b, a digital reference signal is continuously wirelessly transmitted from the reference signal transmitting unit 318 of the control side radio communication device 300 to the reference signal receiving unit 218 of the coil side radio communication device 200A during imaging.

More specifically, the reference signal is a signal that synchronizes the coil side radio communication device 200A as a transmission side of the MR signals with a basic frequency of system based on the fixed frequency generation unit 406. The reference signal transmitting unit 318 generates the reference signal by performing processing such as modulation, frequency conversion, amplification and filtering on the criteria clock signal inputted from the fixed frequency generation unit 406.

The fixed frequency generation unit 406 generates the criteria clock signal whose frequency is constant. The fixed frequency generation unit 406 includes a crystal controlled oscillator with high degree of stability and so on, in order to generate the criteria clock signal.

The fixed frequency generation unit 406 inputs the criteria clock signal to the reference signal transmitting unit 318 and the variable frequency generation unit 408. Additionally, the fixed frequency generation unit 406 inputs the criteria clock signal to respective components performing clock synchronization inside the MRI apparatus 20A such as the image reconstruction unit 56 and the pulse waveform generation unit 404.

The variable frequency generation unit 408 includes PLL (Phase-Locked Loop), DDS (Direct Digital Synthesizer), and a mixer. The variable frequency generation unit 408 operates based on the above criteria clock signal. The variable frequency generation unit 408 generates a local signal (clock signal) of variable frequency that accords with a setting value inputted from the system control unit 52 as a center frequency of RF pulses.

In order to achieve this, the system control unit 52 inputs a default value of the center frequency of the RF pulses to the variable frequency generation unit 408 before a prescan. Additionally, the system control unit 52 inputs a corrected value of the center frequency of the RF pulses to the variable frequency generation unit 408 after the prescan.

The variable frequency generation unit 408 inputs the above local signal of variable frequency to the frequency downconversion unit 410 and the frequency upconversion unit 402.

Additionally, a trigger signal (A/D conversion start signal) that determines timing of sampling in the A/D converters 212 inside the cover member 104 is inputted from the system control unit 52 to the reference signal transmitting unit 318. The above sampling means, for example, to extract intensity of an analog signal at regular time intervals so as to enable digital record. As an example here, the reference signal transmitting unit 318 wirelessly transmits both the reference signal and the trigger signal to the reference signal receiving unit 218, by superimposing the trigger signal on the reference signal.

Fourthly, in the pathway between the antennas 206a and 306a, the digitized MR signals are wirelessly transmitted from the data transmitting unit 216 of the coil side radio communication device 200A to the data receiving unit 316 of the control side radio communication device 300 via an induced electric field.

More specifically, inside the RF coil device 100, a plurality of the preamplifiers PMP respectively corresponding to the coil elements 106 are disposed in front of the A/D converters 212. The MR signals detected by the respective coil elements 106 of the RF coil device 100 are amplified by each of the preamplifiers PMP, then inputted to the respective A/D converters 212 as analog signals, and then converted into digital signals. At this time, the reference signal and trigger signal are inputted to each of the A/D converters 212 from the reference signal receiving unit 218. Thus, each of the A/D converters 212 starts sampling and quantization based on the reference signal (sampling clock signal) in synchronization with the timing when the trigger signal is transmitted.

Each of the A/D converters 212 inputs the digitized MR signals to the P/S converter 214. The MR signals detected by a plurality of the coil elements 106 and undergone A/D conversion respectively are plural. Therefore, the P/S converter 214 converts these plural MR signals from parallel signals into a serial signal for radio transmission, and inputs the serial signal to the data transmitting unit 216 of the coil side radio communication device 200A via the cable 102. This is because the number of antenna for transmitting the MR signals is only one (the antenna 206a) in the example of the present embodiment.

However, the present embodiment is not limited to the aspect of transmitting the MR signals as a serial signal. For example, the MR signals may be wirelessly transmitted as parallel signals by increasing the number of antennas for transmitting and receiving MR signals.

The data transmitting unit 216 generates MR signals for radio transmission (which are serial signals and digital signals) by performing processing such as error correction encoding, interleave, modulation, frequency conversion, amplification, and filtering on the inputted serial MR signals. The data transmitting unit 216 wirelessly transmits the MR signals for radio transmission from the antenna 206a to the antenna 306a.

The data receiving unit 316 performs processing such as amplification, frequency conversion, demodulation, deinterleave and error correction decoding on the serial MR signals received by the antenna 306a. Thereby, the data receiving unit 316 extracts the original digitized MR signals from the MR signals for radio transmission, and inputs the extracted MR signals to the frequency downconversion unit 410 of the RF receiver 48.

The frequency downconversion unit 410 multiplies the MR signals inputted from the data receiving unit 316 by the local signal inputted from the variable frequency generation unit 408, and makes an arbitrary signal band get through by filtering. Thereby, the frequency downconversion unit 410 performs frequency conversion (downconversion) on the MR signals, and inputs the MR signals whose frequency is lowered to the signal processing unit 412.

The signal processing unit 412 generates raw data of the MR signals by performing predetermined signal processing on the above "MR signals whose frequency is lowered". The raw data of the MR signals are inputted to the image reconstruction unit 56, and converted into k-space data and stored in the image reconstruction unit 56 as described earlier.

Note that, though the RF receiver 48 and the control side radio communication device 300 are explained as mutually separate components in the above configuration, this is only an example. For example, the RF receiver 48 may be composed as a part of the control side radio communication device 300.

Additionally, as to the gate signal, it may be superimposed on the reference signal in the way similar to the trigger signal. In this case, because the number of radio communication pathways can be decreased by one by omitting components such as the antennas 206d and 306d, configuration of the coil side radio communication device 200A and the control side radio communication device 300 can be streamlined.

The foregoing is an explanation of the four radio communication pathways.

In FIG. 6, the system control unit 52 determines the imaging conditions such as a repetition time (RF pulse cycle), a type of RF pulses, a center frequency of the RF pulses and a band width of the RF pulses in a pulse sequence, based on the imaging conditions inputted by a user via the input device 62. The system control unit 52 inputs the imaging conditions determined in the above manner to the pulse waveform generation unit 404.

The pulse waveform generation unit 404 generates a pulse waveform signal of baseband by using the criteria clock signal inputted from the fixed frequency generation unit 406, depending on the imaging conditions inputted from the system control unit 52 in the above manner. The pulse waveform generation unit 404 inputs the pulse waveform signal of baseband to the frequency upconversion unit 402.

The frequency upconversion unit 402 multiplies the pulse waveform signal of baseband by the local signal inputted from the variable frequency generation unit 408, then makes an arbitrary signal band pass by filtering, and thereby performs frequency conversion (upconversion). The frequency upconversion unit 402 inputs the pulse waveform signal of baseband whose frequency is raised to the RF transmitter 46. The RF transmitter 46 generates the RF pulses based on the inputted pulse waveform signal.

Figure 7:
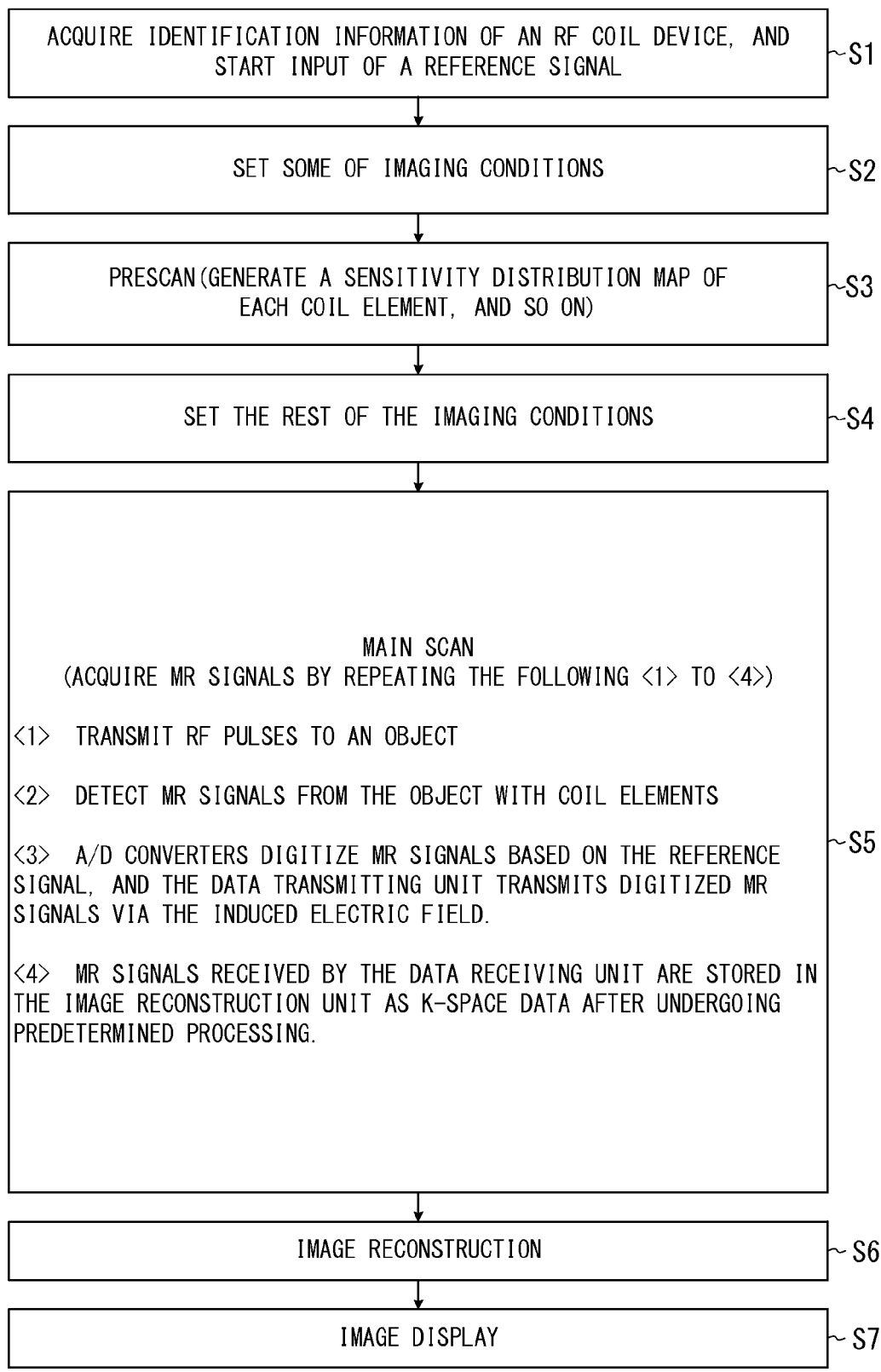
FIG. 7 is a flowchart illustrating an example of flow of imaging operation performed by the MRI apparatus of the first embodiment.

FIG. 7 is a flowchart illustrating an example of the flow of the imaging operation performed by the MRI apparatus 20A of the first embodiment. In the following, according to the step numbers in the flowchart shown in FIG. 7, the imaging operation of the MRI apparatus 20A will be described by referring to the aforementioned FIG. 1 to FIG. 6 as required.

Note that, although a case of using the above RF coil device 100 will be explained as an example here, the same effects as the present embodiment can be obtained by disposing components similar to the coil side radio communication device 200A in other cases where other RF coil devices such as a shoulder RF coil device and a head RF coil device are used.

[Step S1] Under the state in which the table 34 is outside the gantry 21, the RF coil device 100 is set on the object P on the table 34, and the coil side radio communication device 200A is detachably fixed to the nearest control side radio communication device 300. That is, the coil side radio communication device 200A is interdigitated with the fixing structure 500A by sliding the coil side radio communication device 200A on the top surface the table 34, for example. Thereby, the coil side radio communication device 200A is detachably and closely fixed to one of the control side radio communication devices 300 on the table 34, for example (see FIG. 2 to FIG. 5).

If the coil side radio communication device 200A and the control side radio communication device 300 fall within the range capable of mutual communication by the above short-distance fixation, the aforementioned electric power supply and communication are started between both sides.

More specifically, the ID transmitting unit 222 wirelessly transmits the identification information of the RF coil device 100 to the ID receiving unit 322, by operating with the use of electric power wirelessly supplied from the ID receiving unit 322.

Here, the antenna 306c of each the control side radio communication device 300 outputs electromagnetic waves at regular time intervals constantly while the table 34 is not inserted into the gantry 21. Therefore, when the coil side radio communication device 200A is fixed within the range capable of radio communication, wireless transmission of the identification information is immediately started.

The system control unit 52 acquires this identification information, and recognizes that the RF coil device 100 is currently connected. Thereby, the system control unit 52 gives (outputs) a permission of further communication between the coil side radio communication device 200A and the control side radio communication device 300, and makes the power supply unit 320 supply electric power to the power receiving unit 220.

The system control unit 52 acquires this identification information, and recognizes that the RF coil device 100 is currently connected. Thereby, the system control unit 52 gives (outputs) a permission of further communication between the coil side radio communication device 200A and the control side radio communication device 300, and makes the power supply unit 320 supply electric power to the power receiving unit 220.

Therefore, the power supply unit 320 and the power receiving unit 220 start electric power supply to each component of the coil side radio communication device 200A and each component of the cover member 104, via an induced magnetic field as described earlier.

Additionally, the reference signal transmitting unit 318 start inputting the digital reference signal to the reference signal receiving unit 218 through the radio communication pathway between the antennas 306b and 206b via, for example, an induced electric field, according to the communication permission outputted by the system control unit 52 (the reference signal is continuously wirelessly transmitted). Note that, the trigger signal for determining sampling timing is superimposed (added) on the transmitted reference signal.

Additionally, the table driving device 32 (see FIG. 1) moves the table 34 to inside of the gantry according to the control by the system control unit 52. After this, the process proceeds to Step S2.

[Step S2] The system control unit 52 sets some of the imaging conditions of the main scan based on the imaging conditions inputted to the MRI apparatus 20A via the input device 62 and information on the currently used RF coil device acquired in Step S1 (in this example, information indicating that the RF coil device 100 is used). After this, the process proceeds to Step S3.

[Step S3] The system control unit 52 makes the MRI apparatus 20A perform prescans by controlling each part of the MRI apparatus 20A. In the prescans, for example, a corrected value of the center frequency of the RF pulses is calculated, and a sensitivity distribution map of each of the coil elements 106 of the RF coil device 100 is generated. After this, the process proceeds to Step S4.

[Step S4] The system control unit 52 sets the rest of the imaging conditions based on the execution results of the prescans. The imaging conditions include information on which of the coil elements 106 are used for detection in the main scan.

Thus, the system control unit 52 inputs the information on the coil elements 106 used for the main scan into the control circuit 108 of the RF coil device 100 via any one of the radio communication pathways. The information on the coil elements 106 used for detection is, for example, wirelessly transmitted from the gate signal transmitting unit 324 to the gate signal receiving unit 224, and then inputted into the control circuit 108 from the gate signal receiving unit 224. After this, the process proceeds to Step S5.

[Step S5] The system control unit 52 makes the MRI apparatus 20A perform the main scan by controlling each component thereof.

More specifically, a static magnetic field is formed in the imaging space by the static magnetic field magnet 22 excited by the static magnetic field power supply 41. In addition, electric current is supplied from the shim coil power supply 42 to the shim coil 24, and thereby the static magnetic field formed in the imaging space is uniformed.

Note that, during the implementation term of the main scan, the aforementioned gate signal is continuously transmitted between the antennas 306d and 206d from the gate signal transmitting unit 324 to the gate signal receiving unit 224.

After this, when the system control unit 52 receives a command of start of imaging from the input device 62, the MR signals from the object P are acquired (collected) by repeating the following processes of <1> to <4> in series.

<1> The system control unit 52 drives the gradient magnetic field power supply 44, the RF transmitter 46 and the RF receiver 48 according to the pulse sequence, thereby gradient magnetic fields are formed in the imaging region including the imaging part of the object P, and the RF pulses are transmitted from the transmission RF coil 28 to the object P. Only during the transmission period of the RF pulses, the gate signal is set to, for example, on-level, and this sets each of the coil elements 106 of the RF coil device 100 to off-state so as to prevent the aforementioned coupling.

<2> The gate signal is switched over to, for example, off-level after transmission of the RF pulses, and each of the coil elements 106 detects the MR signals caused by nuclear magnetic resonance inside the object P. The detected analog MR signals are inputted from each of the coil elements 106 to each of the preamplifiers PMP, amplified by each of the preamplifiers PMP, and then inputted to each of the A/D converters 212, respectively (see FIG. 6).

Note that, as an example here, the control circuit 108 of the RF coil device 100 makes only the preamplifiers PMP and the A/D converters 212 which respectively correspond to the coil elements 106 selected for detection in the Step S4 drive.

That is, the preamplifiers PMP and the A/D converters 212 which respectively correspond to the coil elements 106 which are not selected in the Step S4 do not operate. Thereby, only the MR signals detected by the coil elements 106 selected for detecting MR signals are wirelessly transmitted to the control side of the MRI apparatus 20A. Therefore, the MR signals which are not used for image reconstruction are not wirelessly transmitted, and transmitted data amount is minimized as a result. Thus, data transmission time will not be prolonged redundantly.

However, all of the MR signals detected by all of the coil elements 106 inside the RF coil device 100 may be wirelessly transmitted to the control side of the MRI apparatus 20A, and the necessary MR signals are extracted in the RF receiver 48 or the image reconstruction unit 56. In this case, the processing of inputting the information on the coil elements 106 used for detection in the main scan to the control circuit 108 of the RF coil device 100 in the Step S4 is unnecessary.

<3> Each of the A/D converters 212 corresponding to the coil elements 106 selected for detection starts sampling and quantization of the MR signals in synchronization with the timing when the trigger signal is wirelessly transmitted. Each of the A/D converters 212 inputs the digitized MR signals to the P/S converter 214, respectively.

The P/S converter 214 converts the inputted plural MR signals into a serial signal, and inputs the serial signal to the data transmitting unit 216.

The data transmitting unit 216 generates MR signals for radio transmission by performing predetermined processing on the serial signal of the MR signals, and wirelessly transmits the serial signal from the antenna 206a to the antenna 306a via induced electric fields.

<4> The data receiving unit 316 extracts the original digital MR signals by performing predetermined processing on the serial signal for radio transmission received by the antenna 306a, and inputs the extracted MR signals to the frequency downconversion unit 410.

The frequency downconversion unit 410 performs frequency downconversion on the inputted MR signals, and inputs the MR signals whose frequency is lowered to the signal processing unit 412.

The signal processing unit 412 generates raw data of the MR signals by performing predetermined processing on the inputted MR signals. The raw data of the MR signals are inputted to the image reconstruction unit 56, and converted into k-space data and stored in the image reconstruction unit 56.

After completion of acquisition of the MR signals by repeating the above <1> to <4> processes, the process proceeds to Step S6.

[Step S6] The image reconstruction unit 56 reconstructs image data by performing image reconstruction processing including Fourier transformation on the k-space data. The image reconstruction unit 56 stores the reconstructed image data in the image database 58 (see FIG. 1). After this, the process proceeds to Step S7.

[Step S7] The image processing unit 60 obtains the image data from the image database 58 and generates display image data by performing predetermined image processing on the obtained image data. The image processing unit 60 stores the display image data in the storage device 66. Then, the system control unit 52 transmits the display image data to the display device 64, and makes the display device 64 display images indicated by the display image data.

After completion of imaging, the coil side radio communication device 200A is detached from fixing structure 500A by sliding the coil side radio communication device 200A in such a manner that the jut 240a gets out of the insertion hole 506. Thereby, the coil side radio communication device 200A is detached from the control side radio communication device 300. When both of them are moved beyond the range capable of radio communication, radio communication and electric power supply between both sides are concluded.

Note that, as an example in FIG. 7, the input of the reference signal starts in Step S1. However, this is only an example. For example, the input of the reference signal may start just before the prescans in Step S3 (i.e. after setting the imaging conditions in Step S2).

The foregoing is a description of the operation of the MRI apparatus 20A according to the present embodiment.

As just described in the first embodiment, the transmission side and the receiving side are closely fixed to each other in time of radio communication, and the radio communication via an induced electric field is performed. Therefore, because output power of radio communication can be more lowered than digital radio communication of conventional technology, the MRI apparatus 20A of the present embodiment easily accommodates to legal regulations in various countries.

In addition to the mutually closely-situated transmission side and receiving side, output power of radio communication can be lowered. Therefore, the problem that the transmitted radio waves are reflected off surrounding areas and this degrades own data of radio communication does not occur. Thus, digitized MR signals can be wirelessly transmitted satisfactorily from the RF coil device 100 side to the control side of the MRI apparatus 20A (the RF receiver 48 side).

Additionally, a plurality of the MR signals respectively detected by the plurality of the coil elements 106 are converted into a serial signal and then wirelessly transmitted. Thus, the necessary number of an antenna for transmitting the MR signals (radio communication pathway) is only one pair, and frequency separation for preventing interference is not necessary between each of the MR signals.

On the other hand, in the digital radio communication of conventional technology, the receiving side is located far away from the transmission side. Thus, in the digital radio communication of conventional technology, frequency separation and time-multiplexed communication are performed, because interference such as cross talk occurs if a plurality of coil elements for receiving MR signals are simultaneously connected. In a short-distance radio communication like the present embodiment, it is not necessary to perform time-multiplexed communication.

Additionally, the control side radio communication devices 300 are respectively disposed to mutually separated positions, and it is enough to fix the coil side radio communication device 200A to any one of the control side radio communication devices 300. Thus, no matter which part of the object P an RF coil device is set on (i.e. no matter where the RF coil device 100 is located on the table 34), the coil side radio communication device 200A and the control side radio communication device 300 can be closely fixed to each other and the MR signals can be wirelessly transmitted satisfactorily.

Additionally, because the fixing structure 500A serves as a landmark, it is easy to position the coil side radio communication device 200A to a place capable of radio communication with one of the control side radio communication devices 300. Moreover, because the coil side radio communication device 200A can be detachably and surely fixed beside the control side radio communication devices 300 by the fixing structure 500A, communication error caused by human error can be infallibly prevented.

Additionally, because the electric power supply to the RF coil device 100, the transmission of the gate signal and the transmission of the trigger signal are wirelessly performed, configuration of the MRI apparatus 20A can be simplified. As a result, cost of manufacturing the MRI apparatus 20A can be reduced.

According to the aforementioned embodiment, digitized MR signals can be wirelessly transmitted from an RF coil device to an MRI apparatus satisfactorily, in MRI.

Additionally, because the coil side radio communication device can be fixed beside the control side radio communication device with a more secure method, communication error caused by human error can be prevented.

Hereinafter, supplementary notes of the first embodiment will be explained.

In the above embodiment, an example in which the number of the insertion hole 506 of the fixing structure 500A and the jut 240a of the coil side radio communication device 200A is respectively one has been explained. However, embodiments of the present invention are not limited to such an aspect. The number of the insertion hole 506 and the jut 240a may be respectively plural.

In the above embodiment, an example in which the jut 240a is columnar and the insertion hole 506 is in the form of interdigitating the jut 240a has been explained. However, embodiments of the present invention are not limited to such an aspect. For example, the jut 240a may be in the form of a rectangular parallelepiped or tapered so as to be easily inserted. As long as the jut 240a can be detachably fixed, the shape of the insertion hole 506 does not need to accord with the jut 240a. For example, the jut 240a may be in the form of a rectangular parallelepiped and the insertion hole 506 may be circularly open. Additionally, inner surface of the insertion hole 506 does not need to be smooth, but concavity and convexity may be formed on the inner surface of the insertion hole 506 so as to ensure fixation by the frictional force.

In the above embodiment, an example in which the supporting member 502a of the fixing structure 500A is in the form of L-letter and only one of the four lateral sides of the coil side radio communication device 200A is attached firmly to the supporting member 502a during fixation has been explained. However, embodiments of the present invention are not limited to such an aspect. For example, the supporting member 502a may be open only into the lateral side into which the coil side radio communication device 200A is inserted like the fixing structure 500D in the later-described fourth embodiment. Note that, it is easy to approach from more directions in the case of the L-letter shape when the coil side radio communication device 200A is made to slide towards the fixing structure 500A.

Additionally, as an alternative configuration, a jut may be formed on the side of the supporting member 502a of the fixing structure 500A and an insertion hole in the form of interdigitating this jut may be formed on the chassis of the coil side radio communication device 200A.

The Second Embodiment

Next, the MRI apparatus 20A of the second embodiment will be explained. Note that, the MRI apparatuses 20A of the second to the fifth embodiments differ only in the fixing structure which fixes the coil side radio communication device from the first embodiment. Thus, only different points will be explained.

Figure 8:
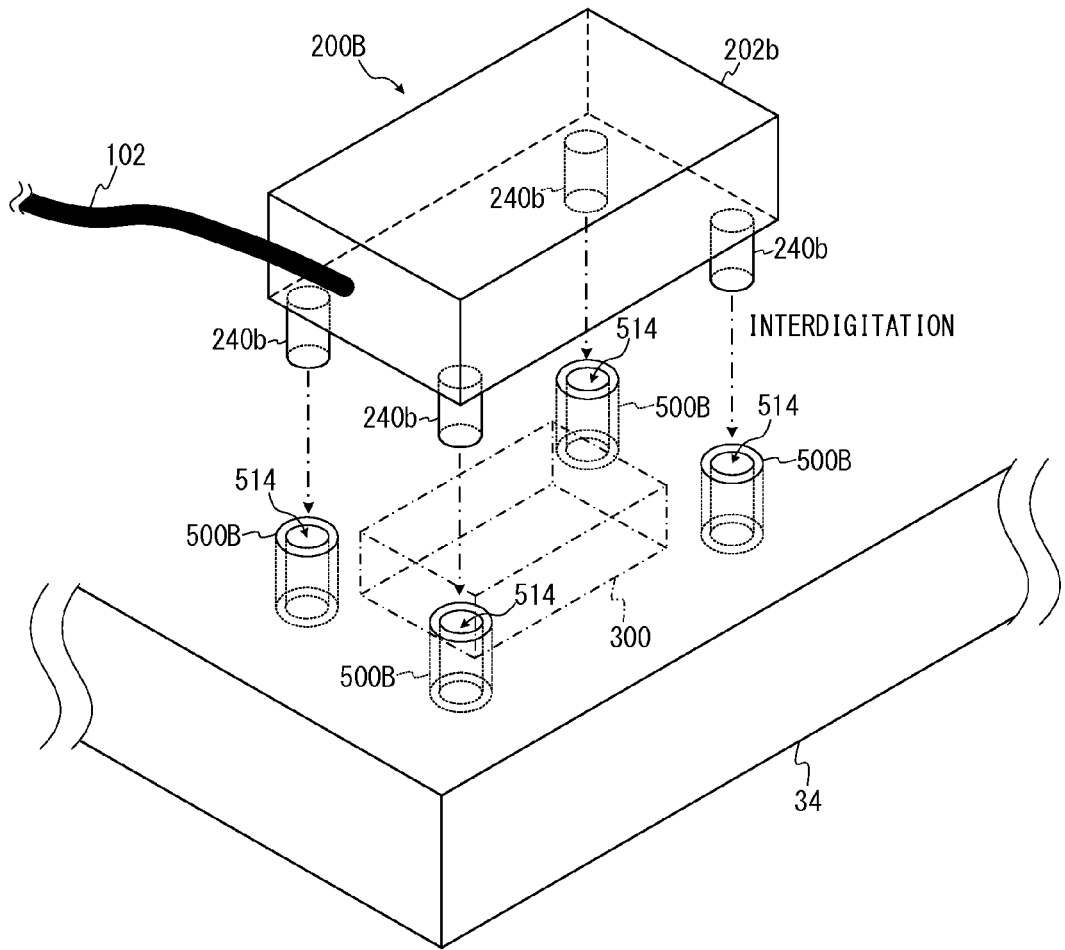
FIG. 8 is a schematic oblique drawing showing the fixing structure that fixes the coil side radio communication device in the MRI apparatus of the second embodiment.

FIG. 8 is a schematic oblique drawing showing the fixing structure 500B that fixes the coil side radio communication device 200B in the MRI apparatus 20A of the second embodiment. As shown in FIG. 8, the chassis 202b of the coil side radio communication device 200B is, for example, in the form of a rectangular parallelepiped, and four juts 240b are fixed to the four corners of its bottom aspect. As to this fixing method, bonding may be used, or the juts 240b may be integrally formed as a part of the chassis 202b. Each of the juts 240b is formed in the shape of a column by using undeformable nonmagnetic material, for example.

Additionally, four fixing structure 500B are disposed on the table 34. The respective fixing structures 500B are positioned to slightly external side of the four corners of the control side radio communication device 300 embedded inside the table 34 in the way similar to the first embodiment.

Each of the fixing structures 500B is shaped in the form of a cylinder by using elastic material such as silicone rubber, polyethylene or synthetic resin. That is, in the center of each of the fixing structures 500B, a circularly open insertion hole 514 is formed respectively. These insertion holes 514 are in the form of interdigitating each of the juts 240b.

Figure 9:
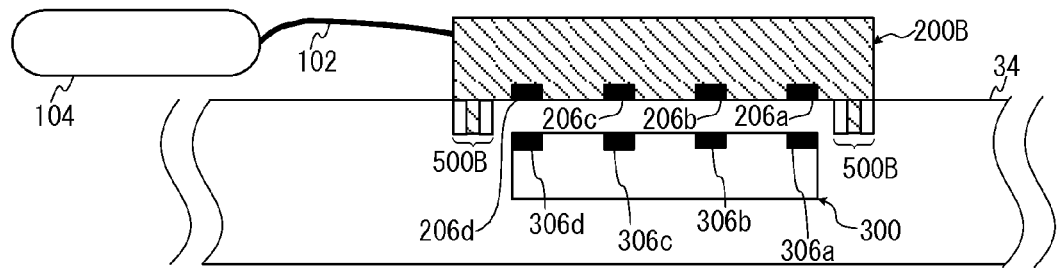
FIG. 9 is a schematic cross-sectional diagram showing the state in which each jut of the coil side radio communication device is interdigitated with the fixing unit of the table in the second embodiment.

FIG. 9 is a schematic cross-sectional diagram showing the state in which each jut 240b of the coil side radio communication device 200B is interdigitated with the fixing structure 500B of the table 34 in the second embodiment.

As shown in FIG. 9, only by inserting the respective juts 240b into the respective fixing structures 500B, the coil side radio communication device 200B is fixed to a place where it faces the control side radio communication devices 300. The antennas 206a to 206d of the coil side radio communication device 200B are disposed so as to respectively face the antennas 306a to 306d the control side radio communication devices 300 under this fixed state.

Additionally, because each of the juts 240b is inserted into each of the fixing structures 500B arranged outside the control side radio communication devices 300, the square measure of the bottom surface (the surface on the antennas side) of the chassis 202b is larger than the top surface (the surface on the antennas side) of the control side radio communication devices 300.

When imaging is finished, the coil side radio communication device 200B is uplifted so as to separate from the table 34. Other structures of the MRI apparatus 20A of the second embodiment are the same as the first embodiment.

As described above, in the second embodiment, the coil side radio communication device 200B can be detachably and unfailingly fixed to a place capable of the radio communication via an induced electric field with the control side radio communication device 300. Thus, in the second embodiment, the effects similar to the first embodiment can be obtained. Moreover, in the second embodiment, because the fixing structures 500B are mainly composed of the insertion holes 514 formed on the table 34, there is no prominent part on the table 34. Thus, the second embodiment is advantageous for a case where the top surface of the table 34 is desired to be flatter.

The Third Embodiment

Next, the MRI apparatus of the third embodiment will be explained.

Figure 10:
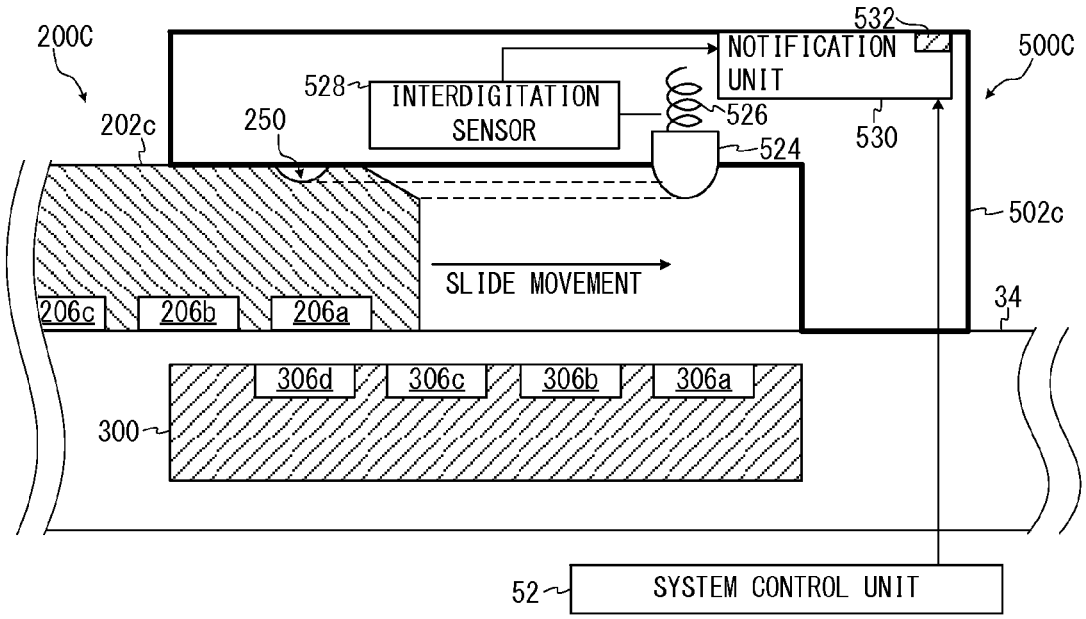
FIG. 10 is a schematic cross-sectional diagram showing the fixing structure under the state in which the coil side radio communication device is not fixed thereto in the MRI apparatus of the third embodiment.

FIG. 10 is a schematic cross-sectional diagram showing the fixing structure 500C under the state in which the coil side radio communication device 200C is not fixed thereto in the MRI apparatus 20A of the third embodiment.

Figure 11:
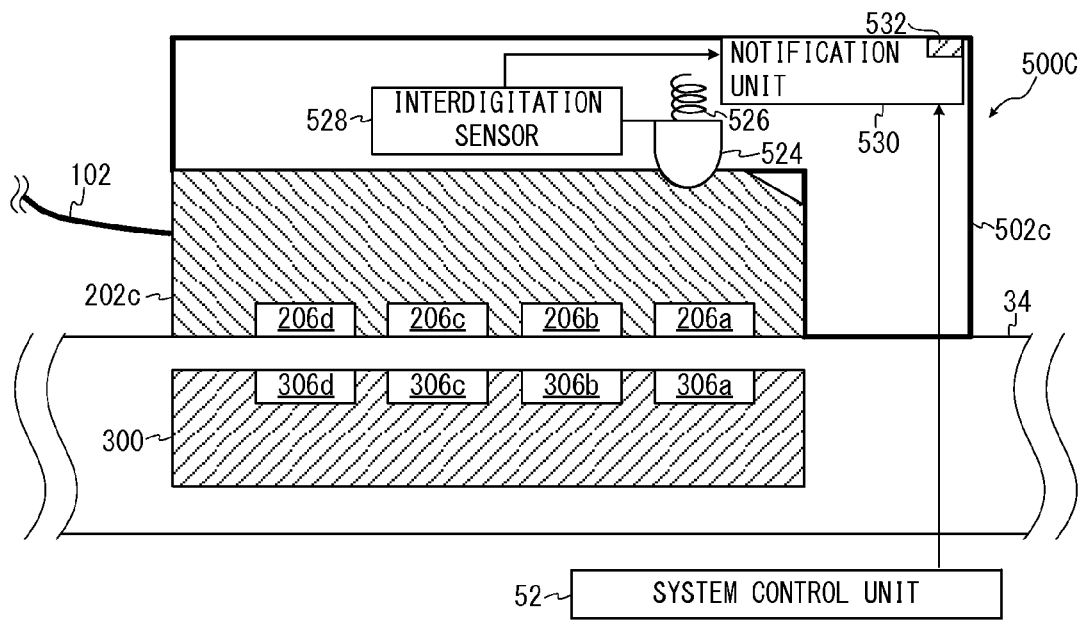
FIG. 11 is a schematic cross-sectional diagram showing the fixing structure under the state in which the coil side radio communication device is fixed thereto in the MRI apparatus of the third embodiment.

FIG. 11 is a schematic cross-sectional diagram showing the fixing structure 500C under the state in which the coil side radio communication device 200C is fixed thereto in the MRI apparatus 20A of the third embodiment.

The fixed state of FIG. 11 can be obtained by sliding the coil side radio communication device 200C towards the inner side of the fixing structure 500C on the table 34 from the state of FIG. 10.

As shown in FIG. 11, the lateral surface opposite to the surface where the cable 102 is exposed of the chassis 202c of the coil side radio communication device 200C is chamfered obliquely toward its top surface. This is so that insertion of the coil side radio communication device 200C into inside of the fixing structure 500C becomes easier as shown in FIG. 10. Additionally, a dent part 250 is formed on the top surface of the chassis 202c.

The fixing structure 500C disposed on the table 34 includes a supporting member 502c, a jut 524, a spring 526, an interdigitation sensor 528 and a notification unit 530.

The supporting member 502c is shaped so that its transverse section becomes approximately L-letter shaped. The supporting member 502c is made of undeformable nonmagnetic material and fixed to the top surface of the table 34.

The forefront side of the jut 524 sticks out of the supporting member 502c, and the back-end side of the jut 524 is embedded inside the supporting member 502c. The jut 524 is, for example, in the form of a column whose forefront side is spherically chamfered. The forefront side of the jut 524 is in the form of interdigitating the dent part 250.

The spring 526 is fixed to the back-end side of the jut 524, and pushes the jut 524 to the table 34 side. That is, under the state of FIG. 10 in which the coil side radio communication device 200C is not fixed by the fixing structure 500C, the spring 526 is the most stretched state and the jut 524 is in the most jutted state out of the supporting member 502c.

On the other hand, under the state of FIG. 11 in which the coil side radio communication device 200C is fixed by the fixing structure 500C, the forefront of the jut 524 is interdigitated with the dent part 250 and the jut 524 is more inserted into the inside of the supporting member 502c than the state of FIG. 10.

Additionally, as shown in FIG. 10 and FIG. 11, the interspatial interval (thickness) between the supporting member 502c and the table 34 is the same as the thickness of the chassis 202c.

The interdigitation sensor 528 detects that the coil side radio communication device 200C is fixed to the fixing structure 500C by detecting the state in which the jut 524 is inserted into inside the supporting member 502c like in FIG. 11. When the interdigitation sensor 528 detects that the coil side radio communication device 200C is fixed to the fixing structure 500C, the interdigitation sensor 528 inputs a signal indicative of completion of fixation of the coil side radio communication device 200C into the notification unit 530.

Additionally, the antennas 206a to 206d of the coil side radio communication device 200C are arranged so as to respectively face the antennas 306a to 306d of the control side radio communication devices 300 under the fixed state of FIG. 11.

Thus, when the coil side radio communication device 200C is fixed in the above manner, the identification information of the RF coil device 100 is wirelessly transmitted from the coil side radio communication device 200C to the control side radio communication devices 300 via the pathway between the antenna 206c and the antenna 306c, and then inputted into the system control unit 52.

When the system control unit 52 precisely recognizes the above identification information and outputs permission of communication between the coil side radio communication device 200C and the control side radio communication devices 300, the system control unit 52 inputs the signal indicative of permission of communication into the notification unit 530. This is because the fact that the above identification information is precisely received means that radio communication intensity has become strong enough to enable the radio communication via an induced electric field between the coil side radio communication device 200C and the control side radio communication devices 300.

The notification unit 530 includes a light-emitting diode 532. The notification unit 530 notifies the information that the radio communication via an induced electric field between the coil side radio communication device 200C and the control side radio communication devices 300 is enabled, when the following two conditions are satisfied.

The first condition is that the signal indicative of that the coil side radio communication device 200C is fixed is inputted from the interdigitation sensor 528 into the notification unit 530.

The second condition is that the signal indicative of the permission of communication is inputted from the system control unit 52 into the notification unit 530.

Although notification of the information that the above radio communication is enabled is visually performed by making the light-emitting diode 532 emit light, this is only an example. The notification of the information that the above radio communication is enabled may be aurally performed, for example. Specifically, sound indicating that radio communication is enabled may be automatically outputted. Alternatively, the notification unit 530 may output a signal sound (bleep).

Additionally, the third embodiment is not limited to an aspect in which the information indicating the enabled radio communication is notified when the above two conditions are satisfied. For example, the interdigitation sensor 528 may be omitted and the information that the radio communication is enabled is notified, when the above second condition is satisfied.

When imaging is finished, the coil side radio communication device 200C may be slid on the table 34 so as to separate from the fixing structure 500C. Other structures of the MRI apparatus 20A of the third embodiment are the same as the MRI apparatus 20A of the first embodiment.

As just described, in the third embodiment, the coil side radio communication device 200C can be detachably and unfailingly fixed to a position capable of the radio communication via an induced electric field with the control side radio communication devices 300. Thus, in the third embodiment, the effects similar to the first embodiment can be obtained. Moreover, in the third embodiment, when the radio communication via an induced electric field between the coil side radio communication device 200C and the control side radio communication devices 300 is enabled, a user is visually notified of the said effect. Thus, in the third embodiment user-friendliness is further improved.

The Fourth Embodiment

Next, the MRI apparatus 20A of the fourth embodiment will be explained. The fourth embodiment differs in the installation position of the rechargeable battery BA and the fixing method of the coil side radio communication device 200D, as compared with the first embodiment.

Figure 12:
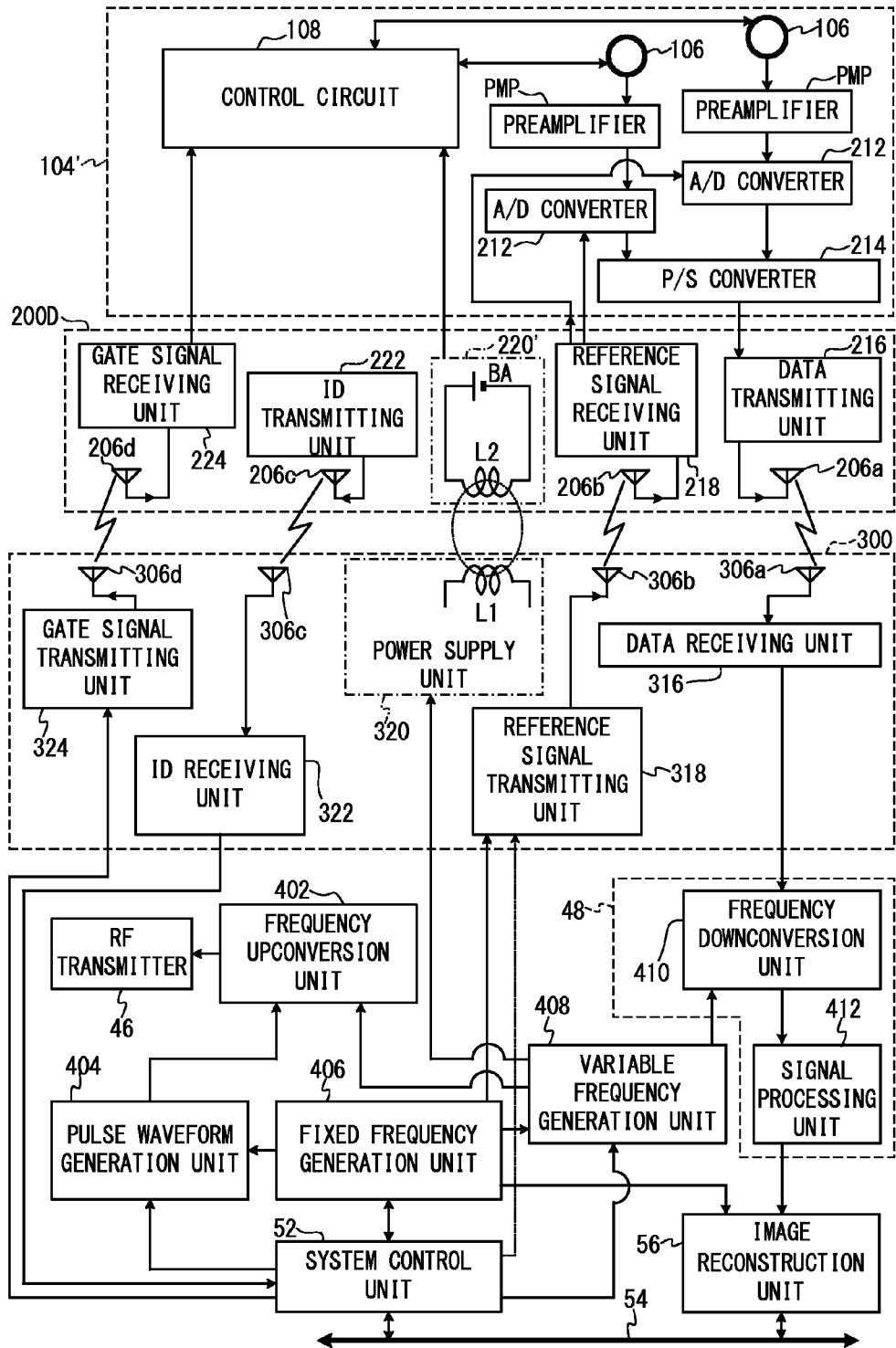
FIG. 12 is a schematic block diagram showing the functions of the respective units relevant to transmission of the MR signals detected by the coil elements of the RF coil device in the MRI apparatus of the fourth embodiment, in the way similar to FIG. 6.

FIG. 12 is a schematic block diagram showing the functions of the respective units relevant to transmission of the MR signals detected by the coil elements 106 in the MRI apparatus 20A of the fourth embodiment, in the way similar to FIG. 6.

As shown in FIG. 12, in the fourth embodiment, the rechargeable battery BA is not disposed inside the cover member 104' of the RF coil device but inside the coil side radio communication device 200D. Thus, all the components of the power receiving unit 220' are disposed inside the coil side radio communication device 200D.

The accumulated electric power of the rechargeable battery BA is supplied to each component inside the coil side radio communication device 200D and each component inside the cover member 104' via the cable 102 (not shown in FIG. 12). Other components inside the cover member 104' are the same as the first embodiment.

Figure 13:
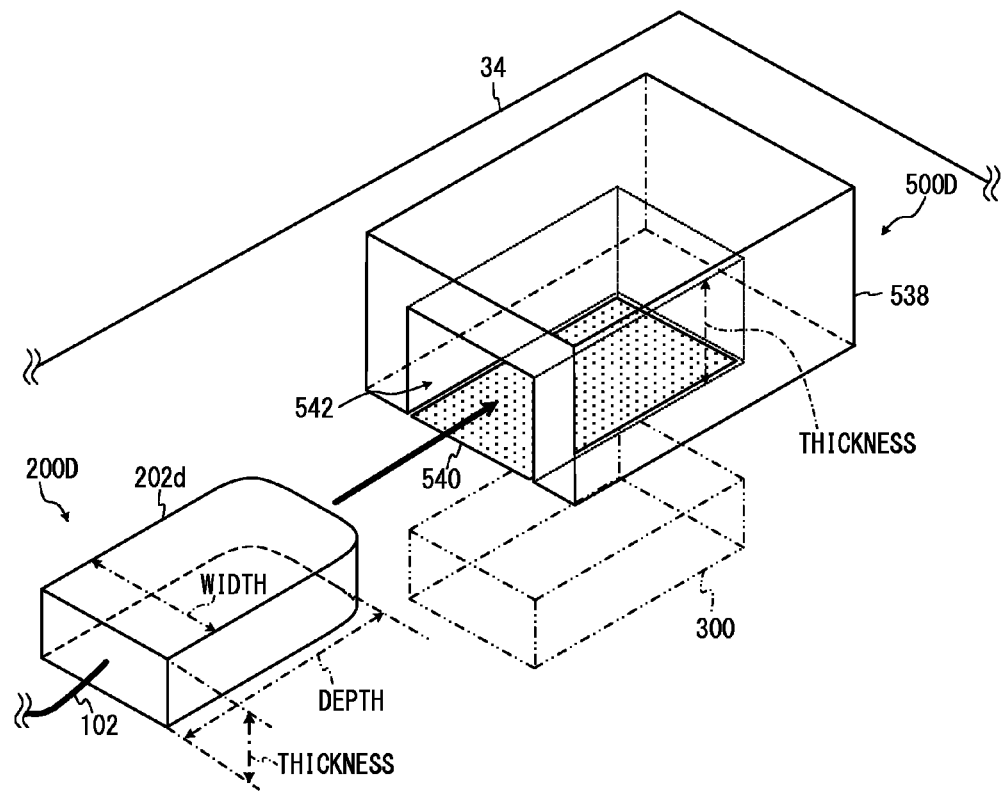
FIG. 13 is a schematic oblique drawing showing the fixing structure under the state in which the coil side radio communication device is not fixed thereto in the MRI apparatus of the fourth embodiment.

FIG. 13 is a schematic oblique drawing showing the fixing structure 500D under the state in which the coil side radio communication device 200D is not fixed thereto in the MRI apparatus 20A of the fourth embodiment.

Figure 14:
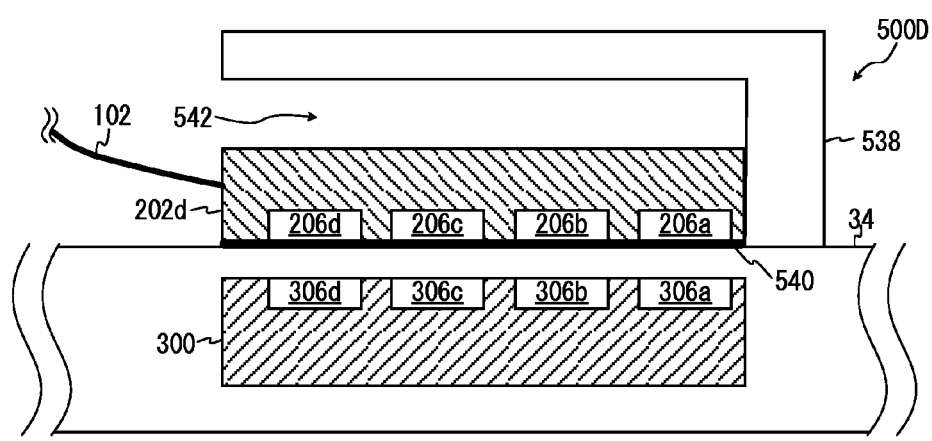
FIG. 14 is a schematic cross-sectional diagram showing the fixing structure under the state in which the coil side radio communication device is fixed thereto in the MRI apparatus of the third embodiment.

FIG. 14 is a schematic cross-sectional diagram showing the fixing structure 500D under the state in which the coil side radio communication device 200D is fixed thereto in the MRI apparatus 20A of the third embodiment.

As shown in FIG. 13, the fixing structure 500D set on the table 34 includes a chassis 538 and a nonslip sheet (antiskid member) 540. The chassis 538 is shaped so that its transverse section is in the form of an angled bracket. The chassis 538 is fixed on the top surface of the table 34, in such a manner that its dent is disposed on the table 34 side. As to method of fixing the chassis 538 to the table 34, it is the same as the first embodiment. The one end of the airspace 542 of the chassis 538 is open and the other end of the chassis 538 is not open (see FIG. 14). The chassis 538 is made of undeformable nonmagnetic material.

The chassis 202d of the coil side radio communication device 200D is approximately in the form of a rectangular parallelepiped and the cable 102 comes out of one of its lateral surfaces.

As to the shape of the chassis 202d, both ends of the lateral surface opposite to the lateral surface out of which the cable 102 comes are chamfered like a lateral surface of a cylinder. This is so that the chassis 202d will be easily inserted into the airspace 542 inside the chassis 202d, because the width (indicated as a chain line in FIG. 13) of the chassis 202d is equal to the width of the airspace 542. Thus, the coil side radio communication device 200D is inserted into the fixing structure 500D, in such a manner that its chamfered surface is directed toward the inner of the airspace 542.

In the airspace 542 between the chassis 538 and the table 34, the nonslip sheet 540 is fixed on the top surface of the table 34. The nonslip sheet 540 is, for example, made by forming concavities and convexities on the surface of material such as silicone rubber. As shown in FIG. 14, immediately beneath the nonslip sheet 540 on the table 34, the control side radio communication devices 300 is embedded.

Additionally, the chassis 538 of the fixing structure 500D is composed in such a manner that the width of the airspace 542 becomes equal to the width of the chassis 202d of the coil side radio communication device 200D and the depth of the airspace 542 becomes equal to the depth of the chassis 202d (see the chain line in FIG. 13). Thus, the coil side radio communication device 200D is kept up (supported) by placing the coil side radio communication device 200D on the nonslip sheet 540 after inserting the coil side radio communication device 200D into the innermost of the airspace 542.

More specifically, the dimension of the chassis 538 is formed in the above manner, and thus the coil side radio communication device 200D never moves in the above width direction (even if the RF coil device 100 and its cable 102 are moved by the movement of the object P during imaging). Additionally, because the inner side of the airspace 542 is not open, the coil side radio communication device 200D never moves towards the innermost of the airspace 542.

Moreover, because the coil side radio communication device 200D is placed on the nonslip sheet 540, the frictional force between both of them prevents the coil side radio communication device 200D from moving towards the entrance side of the airspace 542. Especially, in the fourth embodiment, because the rechargeable battery BA is disposed inside the coil side radio communication device 200D, the weight of the coil side radio communication device 200D is increased. Thus, the weight of the coil side radio communication device 200D is added to the normal reaction (normal force), and thereby the above frictional force is strengthened.

Additionally, the coil side radio communication device 200D is prevented from moving upwards in the vertical direction (in the direction of separating from the nonslip sheet 540) by its own weight. In the fourth embodiment, the rechargeable battery BA is embedded inside the coil side radio communication device 200D so as to enhance the above effects.

The antennas 206a to 206d of the coil side radio communication device 200D are disposed so as to respectively face the antennas 306a to 306d of the control side radio communication devices 300 under the fixed state of the above FIG. 14.

Note that, as an example here, the chassis 538 is formed in such a manner that the thickness of the airspace 542 is thicker than the thickness of the coil side radio communication device 200D by the thickness of two human fingers (see "THICKNESS" shown in FIG. 13 as a chain line). This is so that the coil side radio communication device 200D can be easily inserted into the airspace 542, because the frictional force of the nonslip sheet 540 makes it difficult to insert the coil side radio communication device 200D into the airspace 542 by sliding it on the table 34.

Additionally, each component is configured so that a part of the airspace 542 becomes vacant under the state in which the coil side radio communication device 200D is fixed inside the fixing structure 500D, so it is easy to take out the coil side radio communication device 200D.

As just described, in the fourth embodiment, the coil side radio communication device 200D can be detachably supported to a position capable of the radio communication via an induced electric field with the control side radio communication devices 300. Thus, in the fourth embodiment, the same effects as the first embodiment can be obtained. Although a part of the chassis 202d of the coil side radio communication device 200D is smoothly chamfered as an example in FIG. 13, this is not indispensable. That is, the fourth embodiment has an advantage in that processing on the shape or surface of the chassis 202d of the coil side radio communication device 200D is unnecessary.

Note that, the fixing structure 500D may be composed of the nonslip sheet 540 only, if the following two conditions are satisfied.

The first condition is that the frictional force between the chassis 202d of the coil side radio communication device 200D and the nonslip sheet 540 is strong enough and there is no possibility that the chassis 202d moves in parallel with the top surface of the table 34.

The second condition is that the weight of the chassis 202d of the coil side radio communication device 200D is heavy enough and there is no possibility that the chassis 202d moves upward in the vertical direction.

Alternatively, in order to completely exclude the possibility that the chassis 202d moves upward in the vertical direction, each component may be configured like in the following modified embodiment.

Figure 15:
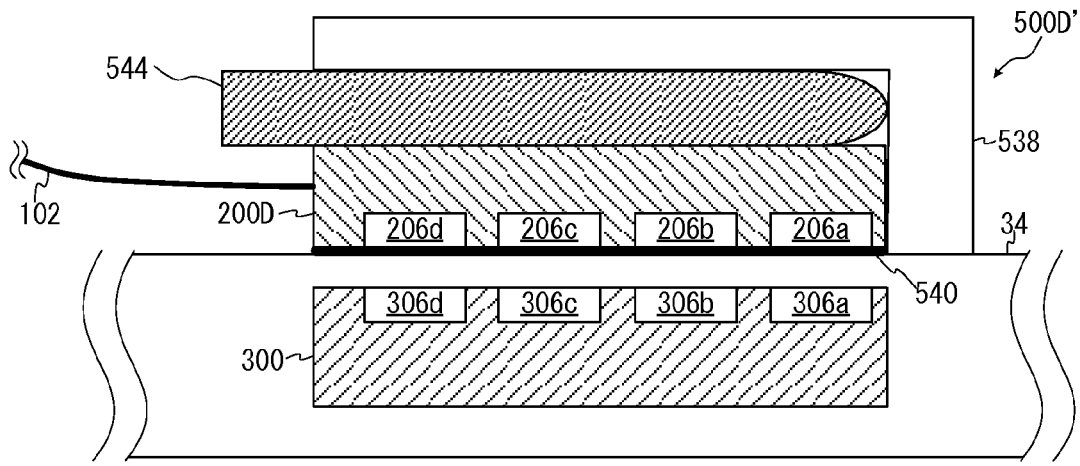
FIG. 15 is a schematic cross-sectional diagram showing the fixing structure of a modified version of the fourth embodiment.

FIG. 15 is a schematic cross-sectional diagram showing the fixing structure 500D' of a modified version of the fourth embodiment.

FIG. 15 indicates a state in which a flat plate 544 is inserted into the vacant part of the airspace 542 after inserting the coil side radio communication device 200D into the innermost of the airspace 542 so as to fix it like in FIG. 14.

The width of the flat plate 544 is, for example, equal to the width of the airspace 542 or slightly narrower than the width of the airspace 542.

The length of the flat plate 544 is longer than the depth of the airspace 542. This is so that the flat plate 544 can be easily taken out.

Additionally, one end side of the flat plate 544 is chamfered like a side surface of a cylinder, so that the flat plate 544 is easily inserted into the airspace 542. The thickness of the flat plate 544 is equal to the difference between the thickness of the airspace (542) and the thickness of the chassis 202d of the coil side radio communication device 200D. Thus, by inserting the flat plate 544 onto the coil side radio communication device 200D in the airspace 542, "the possibility that the chassis 202d moves upward in the vertical direction" is completely excluded.

The Fifth Embodiment

Next, the MRI apparatus 20A of the fifth embodiment will be explained. The fifth embodiment differs in that the coil side radio communication device 200E is fixed by suction (vacuuming it up) from the first to the fourth embodiments.

Figure 16:
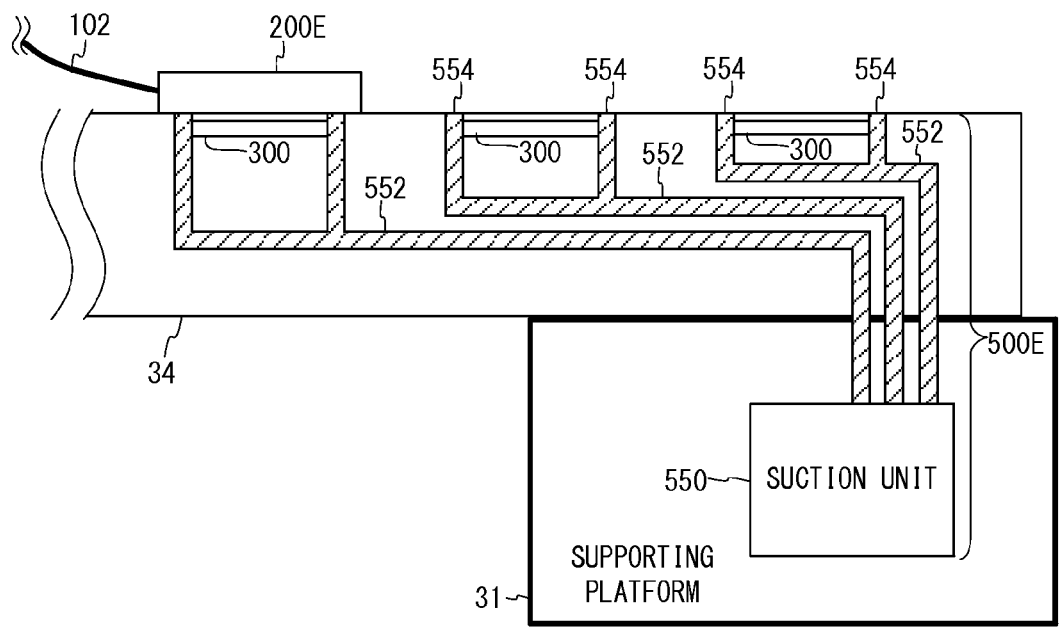
FIG. 16 is a schematic cross-sectional diagram showing the fixing structure of the MRI apparatus of the fifth embodiment.

FIG. 16 is a schematic cross-sectional diagram showing the fixing structure 500E of the MRI apparatus 20A of the fifth embodiment.

The fixing structure 500E includes a suction unit 550, a plurality of suction tubes 552 and a plurality of suction holes 554. The number of the suction tubes 552 is, for example, the same as the number of the control side radio communication devices 300 inside the table 34. That is, the suction tubes 552 are disposed inside the table 34 so as to respectively correspond to the control side radio communication devices 300. As an example here, the number of the suction holes 554 is quadruple of the number of the suction tubes 552. That is, every control side radio communication device 300 corresponds to four of the suction holes 554 which are formed on the top surface of the table 34 (because FIG. 16 is a cross-section, two of the suction holes 554 are shown for each of the suction tubes 552).

Note that, though the suction unit 550 is disposed inside the supporting platform 31 in FIG. 16, this is only an example. For example, in the case of the table 34 with enough thickness, the fixing structure 500E may be disposed to the table 34 by embedding the suction unit 550 inside the table 34.

Figure 17:
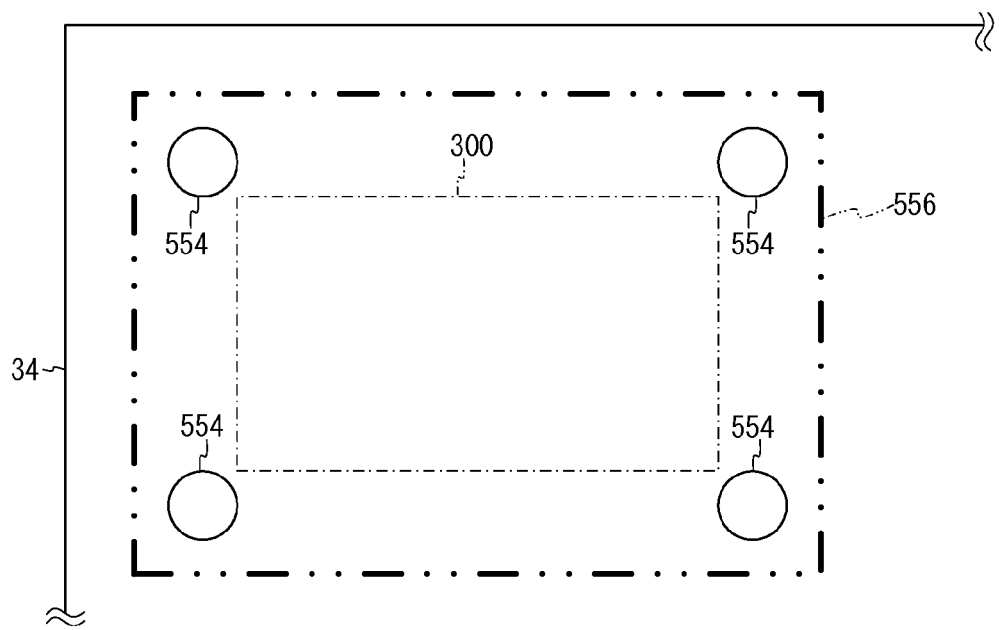
FIG. 17 is a schematic top view showing a part of the table under the state in which the coil side radio communication device is not fixed in the fifth embodiment.

FIG. 17 is a schematic top view showing a part of the table 34 under the state in which the coil side radio communication device 200E is not fixed in the fifth embodiment.

As shown in FIG. 17, four of the suction holes 554 are respectively formed to positions slightly outside the four corners of the control side radio communication devices 300 embedded inside the table 34. These four suction holes 554 are connected to one suction tube 552. Moreover, the guide frame 556 is shown on the table 34 by painting or another method for positioning purpose when the coil side radio communication device 200E is placed (the bold frame shown by the two-dot chain line in FIG. 17). The size and the shape of the guide frame 556 accord with the contour of the bottom face of the chassis of the coil side radio communication device 200E.

Figure 18:
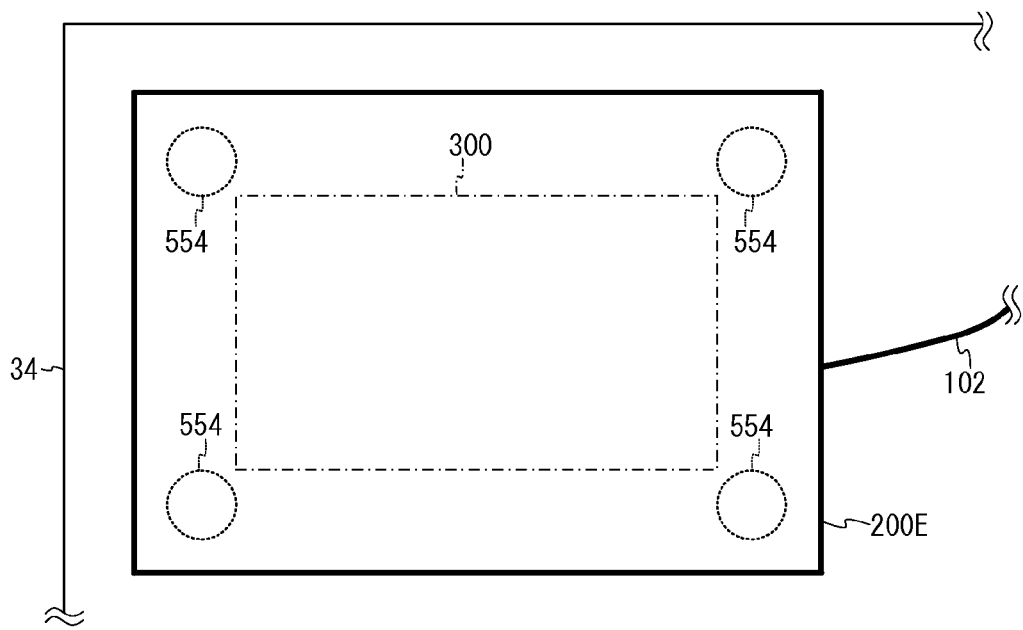
FIG. 18 is a schematic top view showing the state in which the coil side radio communication device is placed so as to bung up the four suction holes from the state of FIG. 17.

FIG. 18 is a schematic top view showing the state in which the coil side radio communication device 200E is placed so as to bung up the four suction holes 554 from the state of FIG. 17. That is, the suction operation is started in the following manner, by placing the coil side radio communication device 200E on the table 34 so that the outline of the coil side radio communication device 200E accords with the guide frame 556.

More specifically, the antennas 206a to 206d of the coil side radio communication device 200E are positioned so as to respectively face the antennas 306a to 306d of the control side radio communication device 300 when the coil side radio communication device 200E is placed in the above manner. Thus, if the coil side radio communication device 200E is placed to the above position, the identification information of the RF coil device 100 is wirelessly transmitted from the coil side radio communication device 200E to the control side radio communication devices 300 and then inputted into the system control unit 52 in the aforementioned manner. At this time, the system control unit 52 also judges which of the control side radio communication devices 300 transferred the identification information, and stores the judged result as information.

When the system control unit 52 precisely recognizes the above identification information and outputs communication permission between the coil side radio communication device 200E and the control side radio communication devices 300 which transferred the identification information (which is the transfer origin of the identification information), the system control unit 52 inputs a signal indicative of communication permission into the suction unit 550. Thereby, a shutter (not shown) between the suction tube 552 connected to the four suction holes 554 blocked up by the coil side radio communication device 200E and inside of the suction unit 550 opens. Other shutters between the rest of the suction tubes 552 and inside of the suction unit 550 are kept closed.

Next, the suction unit 550 evacuates air inside the suction unit 550 outward by rapidly rotating fins (rotor blades) with a motor (not shown). Thereby, the pressure inside the suction unit 550 becomes lower than its outside, and air is drawn into the suction hole 554 immediately beneath the coil side radio communication device 200E via the suction tube 552 opened by the shutter. By such suction, the coil side radio communication device 200E is fixed.

Here, the fact that the control side radio communication device 300 and the system control unit 52 have precisely received (recognized) the above identification information means the radio communication intensity between the coil side radio communication device 200E and the control side radio communication devices 300 has become equal to or stronger than a predetermined value (predetermined strength). This is because the identification information cannot be precisely received if the radio communication intensity does not reach the predetermined value. Thus, the suction operation of the fixing structure 500E is automatically started when the radio communication intensity between the coil side radio communication device 200E and the control side radio communication device 300 becomes equal to or stronger than the predetermined value.

Next, a cessation method of the suction operation will be explained. As to the cessation method, for example, suction stopping buttons may be disposed beside each of the guide frames 556 on the top surface of the table 34, so that the suction operation stops when any one of the suction stopping buttons is pushed. As an example in the fifth embodiment, the suction unit 550 automatically stops the suction at the timing when the table 34 returns to a predetermined position on the supporting platform 31.

Figure 19:
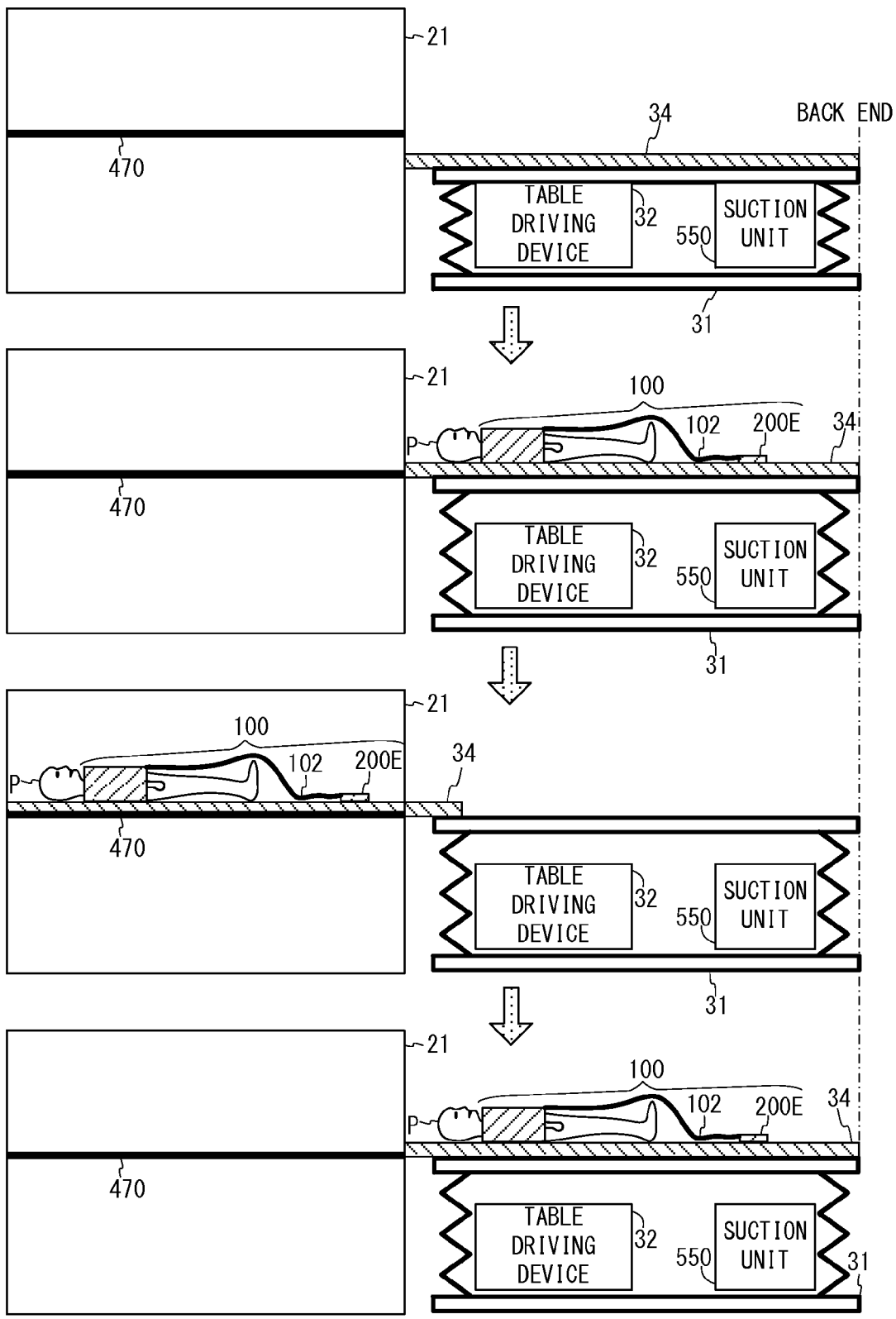
FIG. 19 is a schematic diagram explaining the timing of the automatic cessation of the suction operation with the flow of the slide movement of the table.

FIG. 19 is a schematic diagram explaining the timing of automatic cessation of the suction operation with the flow of the slide movement of the table 34. As an example in FIG. 19, the flow of moving of the table 34 is shown with four phases from the top in order.

The top part of FIG. 19 is a state before start of prescans, and indicates a state in which the height of the supporting platform 31 is lowered. For example, in this state, the object P is loaded on the table 34 of the bed device 30 and the RF coil device 100 is set on the object P. After this, the coil side radio communication device 200E at one end of the cable 102 of the RF coil device 100 is placed so as to accord with the guide frame 556 in FIG. 17. Thereby, the aforementioned suction operation is started.

Next, the table driving device 32 raises the height of the supporting platform 31 so as to accord with the height of rails 470 inside the gantry 21, under the control of the system control unit 52. The second top part of FIG. 19 shows this state. Note that, setting of the RF coil device 100 to the object P and manipulation of placing the coil side radio communication device 200 to a predetermined position may be performed in this state in which the height of the supporting platform 31 is raised as just described.

Next, the table driving device 32 slides the table 34 loading the object P along the rails 470 horizontally into inside of the gantry 21, under the control of the system control unit 52. At this time, the horizontal position of the table 34 is controlled in such a manner that the imaging part of the object P is positioned at the magnetic center inside the gantry 21. The above horizontal direction means the Z axis direction of the aforementioned apparatus coordinate system. The third part from the top in FIG. 19 shows this state. In this state, prescans and the main scan are performed in the way explained in the first embodiment.

Next, when the main scan finishes, the table driving device 32 slides the table 34 loading object P horizontally along the rails 470 under the control of the system control unit 52, so as to return the table 34 to the supporting platform 31 side. The bottom part of FIG. 19 shows a state in which one end side of the table 34 is returned to a predetermined position. The above predetermined position means, for example, a position in which the table 34 is most detached from the gantry 21, and is the back end of the supporting platform 31 shown as a chain line in the example of FIG. 19.

As an example in the fifth embodiment, when one end side of the table 34 is returned to the above predetermined position, the table driving device 32 inputs a signal indicative of the said effect into the suction unit 550. Therefore, in synchronization with the timing when one end side of the table 34 is returned to the above predetermined position (the back end of the supporting platform 31), the suction unit 550 automatically stops the suction operation.

Note that, the above operation is only an example, and the suction unit 550 may automatically stop the suction operation in synchronization with the timing when the motion of the table 34 completely gotten out of the gantry 21 is stopped. The state in which the table 34 has been completely gotten out of the gantry 21 and the motion of the table 34 is stopped means a state capable of changing the height of the supporting platform 31, i.e. a state capable of up-and-down operation of the table 34.

The foregoing is the explanation of the suction operation. However, as to the suction structure, this embodiment is not limited to the aforementioned aspect. The suction unit 550 may be, for example, a hydraulic suction pump.

As just described, in the fifth embodiment, the coil side radio communication device 200E can be detachably and unfailingly fixed to a position capable of the radio communication via an induced electric field with the control side radio communication devices 300. Thus, in the fifth embodiment, the same effects as the first embodiment can be obtained.

Additionally, because the coil side radio communication device 200E is fixed by suction in the fifth embodiment, the fifth embodiment has an advantage in that processing on the shape or surface of the coil side radio communication device 200E is unnecessary, like in the fourth embodiment.

Moreover, in the fifth embodiment, the suction operation is automatically stopped, in synchronization with the timing when the table 34 is returned to the predetermined position on the supporting platform 31 after completion of the main scan. Thus, labor of releasing the connection after imaging is simplified.

Note that, though an example in which the coil side radio communication device 200E is fixed by four of the suction hole 554 has been explained in the fifth embodiment, this is only an example. The coil side radio communication device 200E may be fixed by one, two, three, five or more than five of suction holes. Additionally, though an example in which the suction holes 554 are formed outside the control side radio communication devices 300 has been explained, this is only an example.

Figure 20:
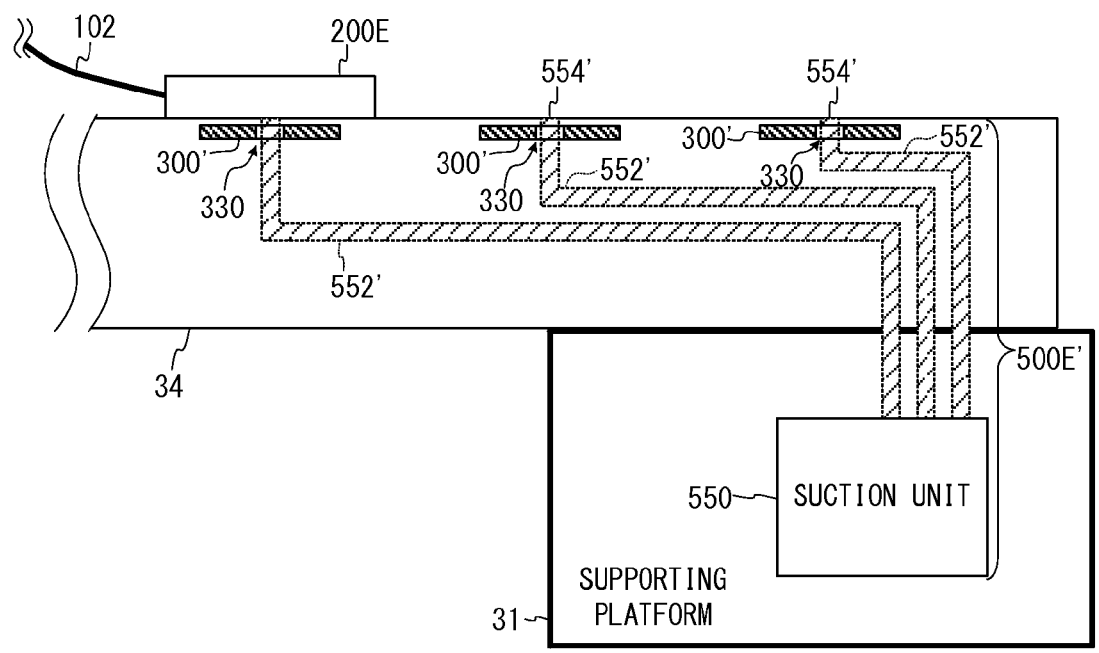
FIG. 20 is a schematic cross-sectional diagram of the fixing structure showing the state in which the number of the suction hole is one and the coil side radio communication device is placed so as to correspond to the guide frame on the top surface of the table, as a modified version of the fifth embodiment.

FIG. 20 is a schematic cross-sectional diagram of the fixing structure 500E' showing the state in which the number of the suction hole 554' is one and the coil side radio communication device 200E is placed so as to correspond to the guide frame 556 on the top surface of the table 34, as a modified version of the fifth embodiment.

Figure 21:
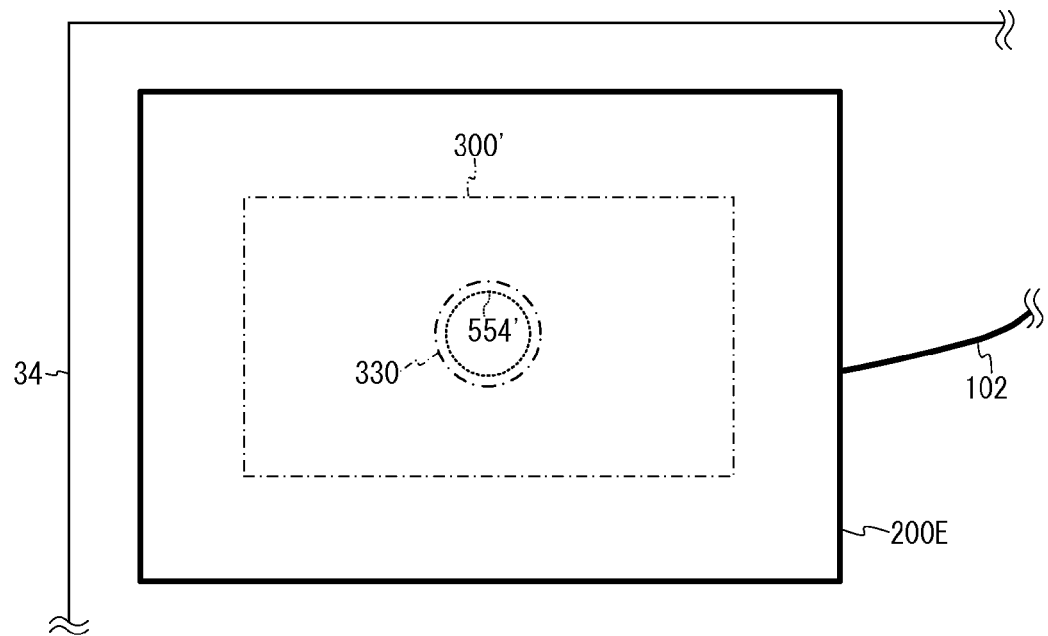
FIG. 21 is a schematic top view showing the state of the table in FIG. 20.

FIG. 21 is a schematic top view showing the state of the table 34 in FIG. 20.

In this modified embodiment, as shown in FIG. 21, an insertion hole 330 is formed at the center of the control side radio communication devices 300'. Other structure of the control side radio communication devices 300' is the same as the control side radio communication devices 300 in the first embodiment. The suction tube 552' penetrates this insertion hole 330 and is connected to the suction hole 554' formed on the top surface of the table 34. In the above structure, the same effects as the embodiment explained with FIG. 16 to FIG. 19 are obtained.

The Sixth Embodiment

Next, the MRI apparatus 20B of the sixth embodiment will be explained. The MRI apparatus 20B of the sixth embodiment includes any one of the fixing structures 500A to 500E of the first to the fifth embodiment and the coil side radio communication device (one of 200A to 200E) corresponding to the fixing structure installed. Thereby, the coil side radio communication device (one of 200A to 200E) is detachably fixed (supported) on the table 34. Thus, in the sixth embodiment, the same effects as the first to the fifth embodiments can be obtained.

One of the characteristics of the MRI apparatus 20B of the sixth embodiment is the structure in which a plurality of the digitized MR signals are conflated (synthesized) into one signal and then inputted into the RF receiver 48. In the following, concrete configuration for achieving the above structure and its merit will be explained.

Figure 22:
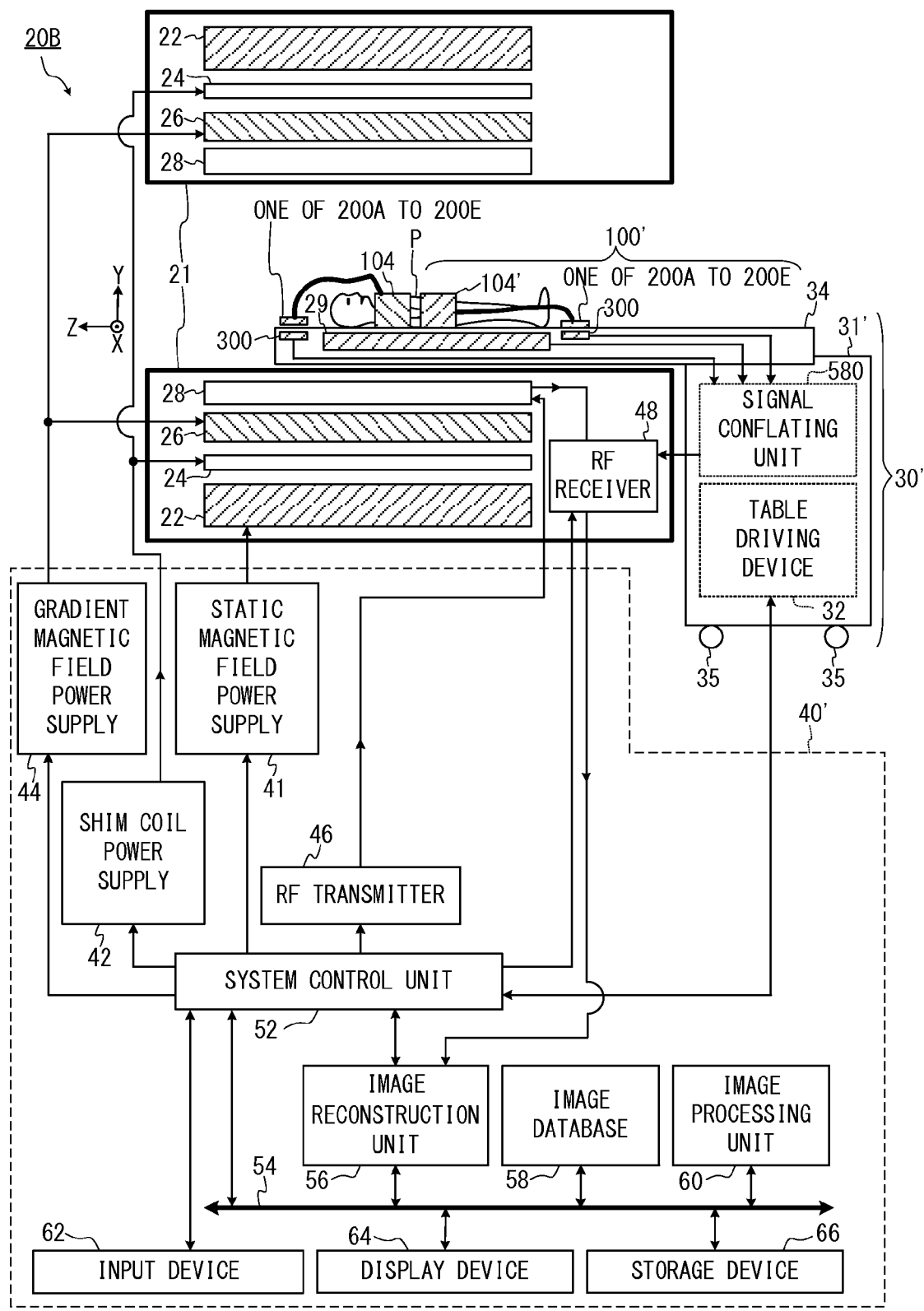
FIG. 22 is a block diagram showing general structure of the MRI apparatus of the sixth embodiment.

FIG. 22 is a block diagram showing general structure of the MRI apparatus 20B of the sixth embodiment. The differences from the first embodiment are the following two points, and other parts of FIG. 22 are the same as the MRI apparatus 20A of the first embodiment.

Firstly, the RF receiver 48 is not disposed inside the control device 40' but inside the gantry 21. Note that, transmission of the raw data of digitized MR signals from the RF receiver 48 to the image reconstruction unit 56, i.e. output from the gantry 21 may be, for example, performed as optical digital signals with the use of optical communication cables. In this case, influence of external noise is reduced.

Secondly, a signal conflating unit 580 which conflates a plurality of digitized MR signals into one signal is disposed inside the supporting platform 31' of the dockable type bed device 30'. Thus, the digitized MR signals wirelessly transmitted to the control side radio communication devices 300 are inputted into the signal conflating unit 580. The functions of the signal conflating unit 580 will be explained by using the next FIG. 23.

Note that, in order for the merits of the present embodiment to be easy-to-understand, it is assumed that a plurality of RF coil devices are set on the object P. In the example of FIG. 22, for instance, the cover member 104' of the RF coil device 100' for the lumbar part is set on the object P in addition to the aforementioned the cover member 104 of the RF coil device 100 for the chest part.

The coil side radio communication device (though it is one of 200A to 200E, hereinafter, the symbol is omitted for simplicity) of one end of the cable 102 of the RF coil device 100 is closely fixed to one of the control side radio communication devices 300 in the table 34. Additionally, the coil side radio communication device of one end of the cable of the RF coil device 100' is closely fixed to another one of the control side radio communication devices 300 in the table 34.

Figure 23:
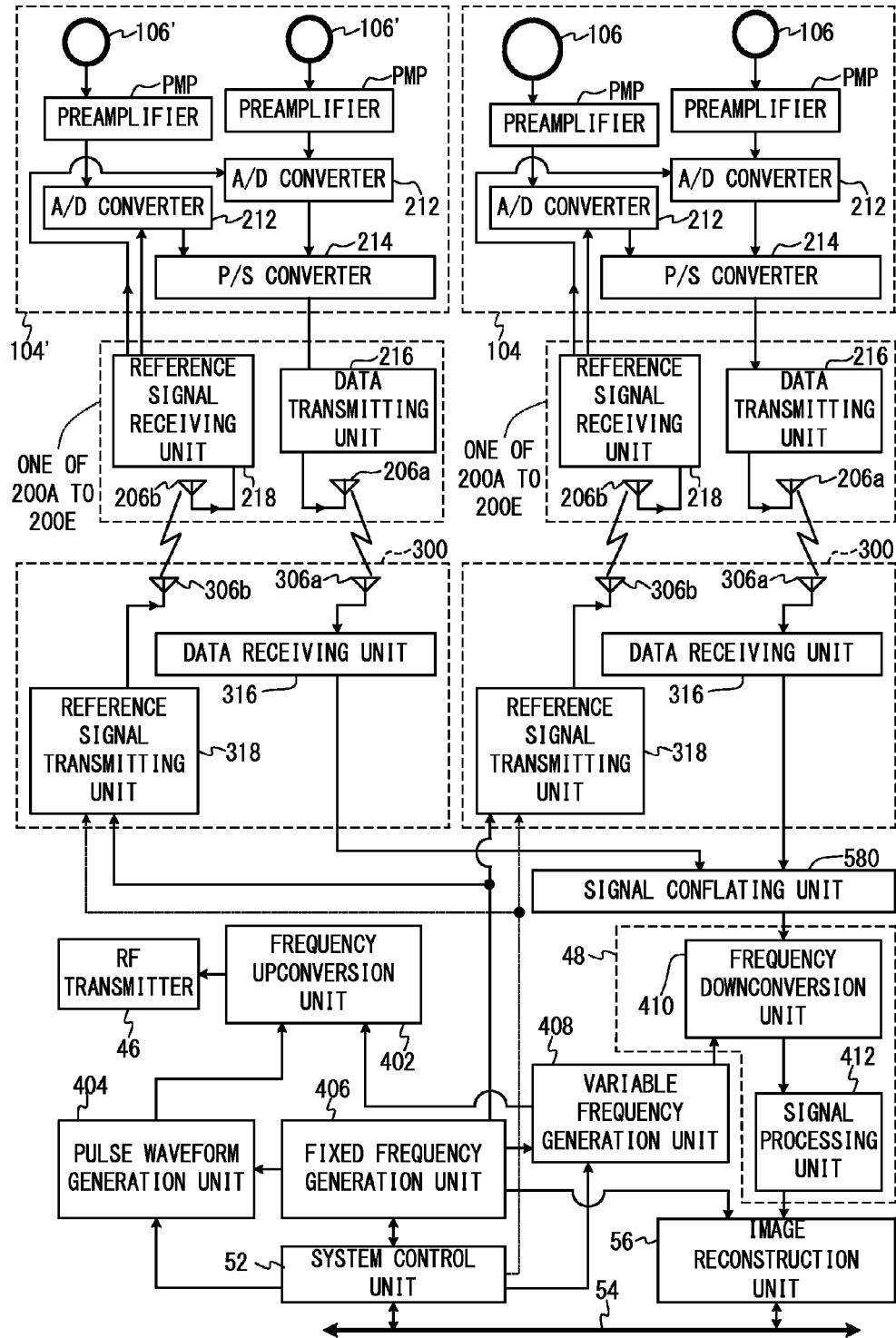
FIG. 23 is a schematic block diagram showing the functions of the respective units relevant to transmission of the MR signals detected by the coil elements of the RF coil device in the sixth embodiment.

FIG. 23 is a schematic block diagram showing the functions of the respective units relevant to transmission of the MR signals detected by the coil elements 106, 106' of the RF coil devices 100 and 100' in the sixth embodiment.

In FIG. 23, the cover member 104' belongs to the RF coil device 100'. Inside the cover member 104', a plurality of the coil elements 106', a plurality of the preamplifiers PMP respectively corresponding to the coil elements 106', a plurality of the A/D converters 212 respectively corresponding to the coil elements 106', the P/S converter 214 and so on are disposed in the way similar to the aforementioned the cover member 104 of the RF coil device 100.

Note that, the control circuits (108) in the respective cover member 104 and 104' are omitted in FIG. 23 in order to avoid a complication, actually they are disposed in the way similar to the first embodiment. For the same reason, though the power receiving unit 220, the ID transmission unit 222, the gate signal receiving unit 224, the antennas 206c and 206d in the coil side radio communication unit are omitted in FIG. 23, actually they are disposed in the way similar to the first embodiment. For the same reason, though the power supply unit 320, the ID receiving unit 322, the gate signal transmitting unit 324, the antennas 306c and 306d of the control side radio communication devices 300 are omitted in FIG. 23, actually they are disposed in the way similar to the first embodiment.

In the following, the flow of processing of the MR signals detected in the main scan will be explained. For simplifying the explanation here, it is assumed that only the two coil elements 106 and the two coil elements 106' shown in FIG. 23 are selected for detection of MR signals.

The MR signals emitted from the chest part of the object P are detected by each of the coil elements 106 inside the cover member 104 of the RF coil device 100, then amplified by the preamplifiers PMP, then inputted into the A/D converters 212, and then converted into a serial signal by the P/S converter 214 in the way similar to the first embodiment.

This serial signal is a digital signal and includes the two MR signals respectively detected by the two coil elements 106.

Additionally, the MR signals emitted from the lumber part of the object P are detected by each of the coil elements 106' inside the cover member 104' of the RF coil device 100', then amplified by the preamplifiers PMP, then inputted into the A/D converters 212, and then converted into a serial signal by the P/S converter 214 in the way similar to the first embodiment. This serial signal is a digital signal and includes the two MR signals respectively detected by the two coil elements 106'.

After this, the serial signal of the RF coil device 100 side is wirelessly transmitted from the coil side radio communication device of the right side of FIG. 23 into the control side radio communication device 300 of the right side of FIG. 23 in the way similar to the first embodiment. After this, the data receiving unit 316 of the control side radio communication device 300 of the right side of FIG. 23 extracts the original digital MR signals from the received MR signals for wireless transmission, and inputs the extracted MR signals into the signal conflating unit 580.

At the same time, the serial signal of the RF coil device 100' side is wirelessly transmitted from the coil side radio communication device of the left side of FIG. 23 into the control side radio communication device 300 of the left side of FIG. 23, similarly. After this, the data receiving unit 316 of the control side radio communication device 300 of the left side of FIG. 23 extracts the original digital MR signals from the received MR signals for wireless transmission, and inputs the extracted MR signals into the signal conflating unit 580.

The signal conflating unit 580 conflates (synthesizes) the two serial signals inputted from the respective data receiving units 316 of both of the control side radio communication devices 300 into one serial signal. That is, the two serial signals respectively received in the two radio communication pathways of the RF coil device 100 side and the RF coil device 100' side are conflated into one serial signal. By the conflation, for example, the signal length becomes twice as long as each of the original signals. The conflated serial signal includes the MR signals detected by the four coil elements (106 and 106'). The signal conflating unit 580 inputs the conflated serial signal into the frequency downconversion unit 410 of the RF receiver 48.

The frequency downconversion unit 410 extracts each of the MR signals respectively corresponding to the four coil elements 106 and 106' (separately). The frequency downconversion unit 410 performs the aforementioned frequency downconversion on each of the MR signals respectively detected by the four coil elements 106 and 106', and inputs each of the MR signals whose frequency is lowered into the signal processing unit 412. The processing after this is the same as the first embodiment.

In the sixth embodiment which has the above configuration, the following effect is obtained in addition to the effects similar to the first to the fifth embodiments. That is, the number of cables for the RF receiver 48 is lessened, and accordingly, checkup, maintenance and repair (component replacement) become easier. The reason is as follows.

In general, the MRI apparatus is shipped in the state resolved into each component, and operation of assembling, installment adjustment and so on are performed at the place where it is installed. In many cases, the supporting platform 31 and the table 34 are shipped in the combined state as a bed device (bed unit). The number of connection cables between the RF coil devices set on the object P and the control side (the RF receiver 48) of the MRI apparatus has been increasing due to prevailing multichannel structure.

For example, in the conventional MRI apparatus which cannot perform wireless transmission of MR signals via an induced electric field, it is assumed that eight connection ports for connecting RF coil devices are disposed on a table or a supporting platform and signal wires of sixteen channels can be connected to the respective connection ports. In this case, for example, 128 signal wires (obtained by 16 times 8) are linked by cable connection between the bed device side and the RF receiver side in the assembling operation.

However, in the structure of the sixth embodiment, the number of signal wires on the supporting platform 31 side is reduced to one by the signal conflating unit 580 in the minimum case. Therefore, operation of linking the signal wires between the supporting platform 31 side and the RF receiver 48 inside the gantry 21 becomes easy. Thus, checkup, maintenance and repair (component replacement) become easier.

Moreover, recently, there are many bed devices configured to be able to dock with the gantry in an imaging room with casters. This type is used for the purpose of carrying a patient to the imaging room after loading the patient onto the table in another room. By applying the sixth embodiment to such dockable type of bed devices, the docking operation just before imaging becomes easier and its labor time is shortened, because the number of signal wires coming out of a bed device side is small.

Note that, in the sixth embodiment, an example in which totally four digitized MR signals are conflated into one serial signal has been explained. However, embodiments of the present invention are not limited to such an aspect. For example, if the number of the signal wires is drastically lessened, the effects similar to the sixth embodiment are obtained. If there are many MR signals respectively detected by many of the coil elements 106 and 106' and all of these MR signals are conflated into one serial signal by the signal conflating unit 580 so as to input it into the RF receiver 48 as one serial signal, longer time corresponding to the length of the serial signal is needed for communication.

Thus, it is preferable to lessen the number of the signal wires in such a manner that the transmission of the MR signals to the RF receiver 48 is completed within a permissible time. For example, the signal conflating units 580 each of which conflates a plurality of digitized MR signals into one serial signal may be disposed as many as the number of signal wires connected to the RF receiver 48. Then, the respective signal wires from the signal conflating units 580 may be connected to the RF receiver 48.

Considering in terms of the above communication time, as explained in the Steps S4 and S5 in FIG. 7 of the first embodiment, it is preferable to wirelessly transmit only the MR signals detected by the coil elements 106 selected for reception to the control side of the MRI apparatus 20B. This is because the amount of transmitted data of the MR signals is minimized.

In the following, correspondences between terms used in the claims and terms used in the embodiment described above will be described. Note that the correspondences described below are just some of possible interpretations for reference and should not be construed as limiting the present invention.

The coil side radio communication devices 200A, 200B, 200C, 200D and 200E are examples of the first radio communication unit and the radio communication unit described in the claims.

The control side radio communication device 300 is an example of the second radio communication unit and the signal acquisition unit described in the claims.

The fixing structures 500A, 500B, 500C, 500D and 500E are examples of the supporting unit described in the claims. That is, support by the supporting unit includes the following two technical meanings.

Firstly, it means a case where the coil side radio communication devices 200A, 200B, 200c and 200E are unfailingly fixed on the table 34, like the fixing structures 500A, 500B, 500C and 500E in the first, second, third and fifth embodiments.

Secondly, it means a case where the position of the coil side radio communication device 200D is kept (maintained) by the frictional force, like the fixing structure 500D in the fourth embodiment.

The coil elements 106 and 106' are examples of the detecting unit described in the claims.

The A/D converter 212 is an example of the A/D conversion unit described in the claims.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
    a first radio communication unit configured to obtain a nuclear magnetic resonance (NMR) signal from an object as detected by an RF (radio frequency) coil device and wirelessly transmit the NMR signal in a digitized state via an induced electric field;
    a second radio communication unit configured to receive the digitized NMR signal;
    an image reconstruction unit configured to reconstruct image data of the object based on the NMR signal received by the second radio communication unit; and
    a table for loading the object into an imaging region of the MRI apparatus, said table including a supporting unit which detachably supports the first radio communication unit with respect to the second radio communication unit that an interval between the first and second radio communication units becomes an interval capable of radio communication via the induced electric field.

2. The magnetic resonance imaging apparatus according to claim 1, wherein:
    the second radio communication unit is embedded inside the table; and
    the supporting unit includes a supporting member configured to interdigitate with the first radio communication unit when the first radio communication unit slides on a surface of the table on which the object is loaded.

3. The magnetic resonance imaging apparatus according to claim 2, further comprising:
    a notification unit configured to notify that radio communication is enabled, when radio communication via the induced electric field is enabled between the first radio communication unit and the second radio communication unit.

4. The magnetic resonance imaging apparatus according to claim 3, wherein:
    the notification unit is configured to notify that radio communication is enabled, by emitting light.

5. The magnetic resonance imaging apparatus according to claim 4, further comprising:
    a signal conflating unit,
    wherein the first radio communication unit and the second radio communication unit respectively include a plurality of radio communication pathways, and perform wireless transmission of a plurality of digitized NMR signals respectively on the plurality of radio communication pathways via an induced electric field; and
    the signal conflating unit is configured to conflate the plurality of digitized NMR signals respectively received by the second radio communication unit into one signal.

6. The magnetic resonance imaging apparatus according to claim 1, wherein:
    the supporting unit includes an antiskid member which exerts frictional force on a chassis of the first radio communication unit;
    the antiskid member is disposed on a surface of the table on which the object is loaded; and
    the second radio communication unit is embedded immediately beneath the antiskid member in the table.

7. The magnetic resonance imaging apparatus according to claim 6, wherein:
    the first radio communication unit includes a rechargeable battery which provides electric power to the RF coil device.

8. The magnetic resonance imaging apparatus according to claim 1, wherein:
    the supporting unit is configured to fix the first radio communication unit by suction.

9. The magnetic resonance imaging apparatus according to claim 8, wherein:
    the supporting unit is configured to automatically start suction of the first radio communication unit when radio communication strength between the first radio communication unit and the second radio communication unit becomes equal to or more than a predetermined value.

10. The magnetic resonance imaging apparatus according to claim 9, further comprising:
    a supporting platform configured to support the table; and
    a table driving device configured to slide the table on the supporting platform;
    wherein the supporting unit is configured to automatically stop suction of the first radio communication unit when the table returns to a predetermined position on the supporting platform.

11. The magnetic resonance imaging apparatus according to claim 10, further comprising:
    a signal conflating unit,
    wherein the first radio communication unit and the second radio communication unit respectively include a plurality of radio communication pathways, and perform wireless transmission of a plurality of digitized NMR signals respectively on the plurality of radio communication pathways via an induced electric field; and
    the signal conflating unit is configured to conflate the plurality of digitized NMR signals respectively received by the second radio communication unit into one signal.

12. The magnetic resonance imaging apparatus according to claim 1, further comprising: a notification unit configured to notify that radio communication is enabled when radio communication via the induced electric field is enabled between the first radio communication unit and the second radio communication unit.

13. The magnetic resonance imaging apparatus according to claim 12, wherein:
the notification unit is configured to notify that radio communication is enabled, by emitting light.

14. The magnetic resonance imaging apparatus according to claim 1, further comprising:
a signal conflating unit,
wherein the first radio communication unit and the second radio communication unit respectively include a plurality of radio communication pathways, and perform wireless transmission of a plurality of digitized NMR signals respectively on the plurality of radio communication pathways via an induced electric field; and
the signal conflating unit is configured to conflate the plurality of digitized NMR signals respectively received by the second radio communication unit into one signal.

15. A bed device that includes a table for loading an object into an imaging region of a magnetic resonance imaging (MRI) apparatus that receives a nuclear magnetic resonance (NMR) signal detected by an RF coil device during an implementation term of MRI, the table comprising:
a signal acquisition unit configured to receive a digitized NMR signal wirelessly transmitted from a radio communication unit of the RF coil device, via an induced electric field; and
a supporting unit configured to support the radio communication unit with respect to the signal acquisition unit so that an interval between the radio communication unit and the signal acquisition unit enables radio communication via the induced electric field.

16. The bed device according to claim 15, further comprising:
a supporting platform configured to support the table in such a manner that the table can slide; and
casters disposed on a bottom of the supporting platform.

17. The bed device according to claim 15, wherein:
the supporting unit includes an antiskid member which exerts frictional force on a chassis of the radio communication unit;
the antiskid member is disposed on a surface of the table on which the object is loaded; and
the signal acquisition unit is embedded immediately beneath the antiskid member in the table.

18. The bed device according to claim 15, wherein:
the supporting unit is configured to fix the radio communication unit by suction.

19. An RF (radio frequency) coil device comprising:
a detecting unit configured to detect a nuclear magnetic resonance (NMR) signal emitted from an object;
an A/D conversion unit configured to digitize the NMR signal; and
a radio communication unit configured to be supported by a supporting unit of a magnetic resonance imaging (MRI) apparatus, and to wirelessly transmit the digitized NMR via an induced electric field when the radio communication unit is supported by the supporting unit.

20. The RF coil device according to claim 19, further comprising:
a preamplifier configured to amplify the NMR signal outputted from the detecting unit and transmit an amplified NMR signal to the A/D conversion unit.

* * * * *